United States Patent
Motozuka et al.

(10) Patent No.: US 9,537,510 B2
(45) Date of Patent: Jan. 3, 2017

(54) VARIABLE SHIFTER, DECODER, AND DATA SHIFTING METHOD

(71) Applicant: Panasonic Intellectual Property Management Co., Ltd., Osaka (JP)

(72) Inventors: Hiroyuki Motozuka, Kanagawa (JP); Hiroyuki Yoshikawa, Tokyo (JP)

(73) Assignee: Panasonic Intellectual Property Managament Co., Ltd., Osaka (JP)

( * ) Notice: Subject to any disclaimer, the term of this patent is extended or adjusted under 35 U.S.C. 154(b) by 106 days.

(21) Appl. No.: 14/611,599

(22) Filed: Feb. 2, 2015

(65) Prior Publication Data

US 2015/0229330 A1 Aug. 13, 2015

(30) Foreign Application Priority Data

Feb. 10, 2014 (JP) ................................. 2014-023853

(51) Int. Cl.
*H03M 13/00* (2006.01)
*G06F 11/00* (2006.01)
*H03M 13/11* (2006.01)

(52) U.S. Cl.
CPC ....... *H03M 13/116* (2013.01); *H03M 13/1105* (2013.01)

(58) Field of Classification Search
CPC ............ H03M 13/1105; H03M 13/116; H03M 13/1162; H03M 13/15
See application file for complete search history.

(56) References Cited

U.S. PATENT DOCUMENTS

2010/0179975 A1* 7/2010 Liao ........................ G06F 5/015
   708/209
2011/0191650 A1   8/2011 Yokokawa

FOREIGN PATENT DOCUMENTS

JP   6-061868      3/1994
JP   2010-093541   4/2010

OTHER PUBLICATIONS

Lu et al., An Efficient Layered Decoding Architecture for Nonbinary QC-LDPC codes, Feb. 2012, IEEE Trans. on Circuits and Sys. I Regular papers, vol. 59, No. 2, pp. 385-398.*
Ajas et al., RADIX 3 Quasi shift network for reconfigurable QC-LDPC decoders, 2013, IEEE, pp. 376 to 379.*
Paul Gigliotti "Implementing Barrel Shifters Using Multipliers" XAPP195 (v1.1) Aug. 17, 2004 pp. 1-4.
Mattew Weiner et al., "LDPC Decoder Architecture for High-Data Rate Personal-Area Networks" IEEE International Symposium on Circuits and Systems (ISCAS), 2011.pp. 1784-1787.
(Continued)

*Primary Examiner* — Shelly A Chase
(74) *Attorney, Agent, or Firm* — Seed IP Law Group LLP

(57) ABSTRACT

A variable shifter includes: a plurality of shifters that cyclically shift input data having a plurality of bits or cyclically shifted data; and a control unit that selects a shift amount for each of the plurality of shifters in accordance with a predetermined cyclic shift amount. The number of types of the predetermined cyclic shift amount is smaller than the number of bits in the input data, each shifter selects one of a plurality of shift amounts in accordance with the predetermined cyclic shift amount, and the plurality of shift amounts have a combination of shift amounts that differ from one shifter to another.

10 Claims, 21 Drawing Sheets

(56) References Cited

OTHER PUBLICATIONS

Jun Tang et al., "Reconfigurable Shuffle Network Design in LDPC Decoders" Application-specific Systems, Architectures and Processors (ASAP'06), 2006 Computer Society.

IEEE Computer Society "Part11: Wireless LAN Medium Access Control (MAC) and Physical Layer (PHY) Specifications Amendment3: Enhancements for Very High Throughput in the 60 GHz Band" IEEE Std 802.11ad, Dec. 28, 2012.

* cited by examiner

FIG. 3

| SHIFT AMOUNT (s) | SHIFT AMOUNT (s1) | SHIFT AMOUNT (s2) |
|---|---|---|
| 2 | 0 | 2 |
| 3 | 1 | 2 |
| 5 | 3 | 2 |
| 13 | 38 | 17 |
| 17 | 0 | 17 |
| 18 | 1 | 17 |
| 20 | 3 | 17 |
| 28 | 38 | 32 |
| 32 | 0 | 32 |
| 33 | 1 | 32 |
| 34 | 38 | 38 |
| 35 | 3 | 32 |
| 38 | 0 | 38 |
| 39 | 1 | 38 |
| 40 | 38 | 2 |
| 41 | 3 | 38 |

FIG. 4

| CIRCUIT SCALE OF BARREL SHIFTER OF RELATED ART | CIRCUIT SCALE OF VARIABLE SHIFTER OF FIRST EMBODIMENT | AMOUNT OF REDUCTION IN CIRCUIT SCALE |
|---|---|---|
| 6X | 4X | 33% |

FIG. 5

| SHIFT AMOUNT (s) | SHIFT AMOUNT (s1) | SHIFT AMOUNT (s2) |
|---|---|---|
| 2 | 37 | 7 |
| 3 | 38 | 7 |
| 5 | 40 | 7 |
| 13 | 33 | 22 |
| 17 | 37 | 22 |
| 18 | 38 | 22 |
| 20 | 40 | 22 |
| 28 | 33 | 37 |
| 32 | 37 | 37 |
| 33 | 38 | 37 |
| 34 | 33 | 1 |
| 35 | 40 | 37 |
| 38 | 37 | 1 |
| 39 | 38 | 1 |
| 40 | 33 | 7 |
| 41 | 40 | 1 |

FIG. 6

| SHIFT AMOUNT (s) | SHIFT AMOUNT (s1) | SHIFT AMOUNT (s2) |
|---|---|---|
| 5 | 18 | 29 |
| 8 | 0 | 8 |
| 12 | 3 | 9 |
| 13 | 0 | 13 |
| 16 | 3 | 13 |
| 26 | 18 | 8 |
| 27 | 18 | 9 |
| 31 | 18 | 13 |
| 32 | 3 | 29 |

FIG. 8

| SHIFT AMOUNT (s) | SHIFT AMOUNT (s1) | SHIFT AMOUNT (s2) | SHIFT AMOUNT (s3) |
|---|---|---|---|
| 0 | 3 | 8 | 31 |
| 1 | 39 | 7 | 39 |
| 2 | 39 | 8 | 39 |
| 3 | 7 | 7 | 31 |
| 4 | 7 | 8 | 31 |
| 7 | 3 | 7 | 39 |
| 8 | 39 | 22 | 31 |
| 11 | 7 | 7 | 39 |
| 12 | 7 | 8 | 39 |
| 14 | 3 | 22 | 31 |
| 16 | 39 | 22 | 39 |
| 18 | 7 | 22 | 31 |
| 22 | 3 | 22 | 39 |
| 26 | 7 | 22 | 39 |
| 35 | 39 | 7 | 31 |
| 36 | 39 | 8 | 31 |
| 41 | 3 | 7 | 31 |

FIG. 11

| COLUMN NUMBER (c) | SHIFT AMOUNT (s) | SHIFT AMOUNT (s1) | SHIFT AMOUNT (s2) |
|---|---|---|---|
| 1 | 35 | 18 | 17 |
| 2 | 19 | 2 | 17 |
| 3 | 41 | 2 | 39 |
| 4 | 22 | 18 | 4 |
| 5 | 40 | 1 | 39 |
| 6 | 41 | 2 | 39 |
| 7 | 39 | 0 | 39 |
| 8 | 6 | 2 | 4 |
| 9 | 28 | 1 | 27 |
| 10 | 18 | 1 | 17 |
| 11 | 17 | 0 | 17 |
| 12 | 3 | 18 | 27 |
| 13 | 28 | 1 | 27 |

FIG. 12

| COLUMN NUMBER (c) | SHIFT AMOUNT (s) | SHIFT AMOUNT (s1) | SHIFT AMOUNT (s2) |
|---|---|---|---|
| 1 | 29 | 1 | 28 |
| 2 | 30 | 31 | 41 |
| 3 | 0 | 1 | 41 |
| 4 | 8 | 31 | 19 |
| 5 | 33 | 5 | 28 |
| 6 | 22 | 0 | 22 |
| 7 | 17 | 31 | 28 |
| 8 | 4 | 5 | 41 |
| 9 | 27 | 5 | 22 |
| 10 | 28 | 0 | 28 |
| 11 | 20 | 1 | 19 |
| 12 | 27 | 5 | 22 |
| 13 | 24 | 5 | 19 |
| 14 | 23 | 1 | 22 |

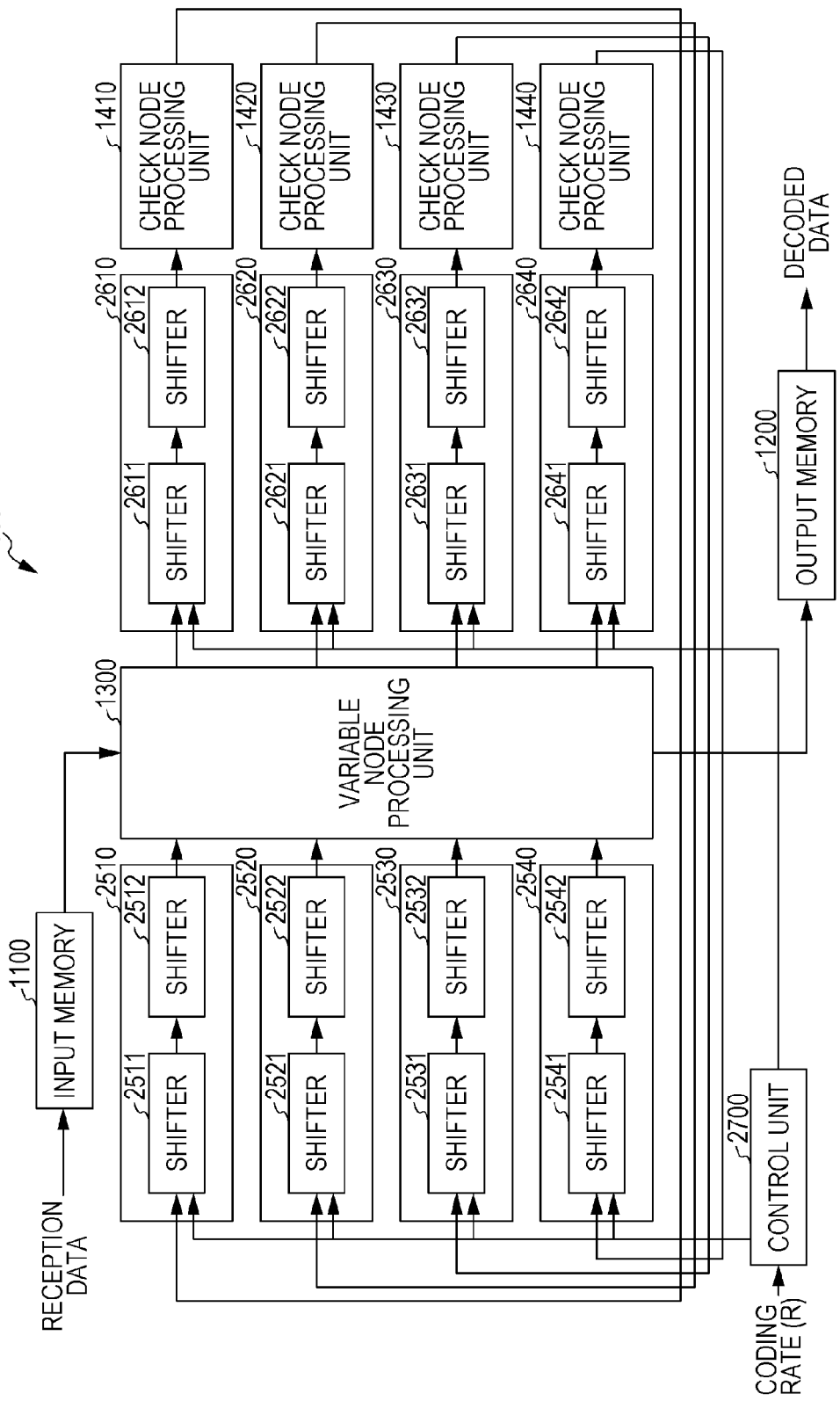

| | | | | | | | | | | | | | | | |
|---|---|---|---|---|---|---|---|---|---|---|---|---|---|---|---|
| $p^{35}$ | $p^{19}$ | $p^{41}$ | $p^{22}$ | $p^{40}$ | $p^{41}$ | $p^{39}$ | $p^{6}$ | $p^{28}$ | $p^{18}$ | $p^{17}$ | $p^{28}$ | | | | ← LAYER 3 |
| $p^{29}$ | $p^{30}$ | $p^{0}$ | $p^{8}$ | $p^{33}$ | $p^{22}$ | $p^{17}$ | $p^{4}$ | $p^{27}$ | $p^{28}$ | $p^{20}$ | $p^{24}$ | $p^{23}$ | | | ← LAYER 2 |
| $p^{37}$ | $p^{31}$ | $p^{18}$ | $p^{23}$ | $p^{11}$ | $p^{21}$ | $p^{6}$ | $p^{20}$ | $p^{32}$ | $p^{9}$ | $p^{12}$ | | $p^{0}$ | $p^{13}$ | | ← LAYER 1 |
| $p^{25}$ | $p^{22}$ | $p^{4}$ | $p^{34}$ | $p^{31}$ | $p^{3}$ | $p^{14}$ | $p^{15}$ | $p^{4}$ | | $p^{14}$ | $p^{13}$ | $p^{13}$ | $p^{22}$ | $p^{24}$ | ← LAYER 0 |

| | | | | | | | | | | | | | | | | |
|---|---|---|---|---|---|---|---|---|---|---|---|---|---|---|---|---|
| $p^{29}$ | $p^{30}$ | $p^{0}$ | $p^{8}$ | $p^{33}$ | $p^{22}$ | $p^{17}$ | $p^{4}$ | $p^{27}$ | $p^{28}$ | $p^{20}$ | $p^{27}$ | $p^{24}$ | $p^{23}$ | | | ← LAYER 2 |
| $p^{37}$ | $p^{31}$ | $p^{18}$ | $p^{23}$ | $p^{11}$ | $p^{21}$ | $p^{6}$ | $p^{20}$ | $p^{32}$ | $p^{9}$ | $p^{12}$ | $p^{29}$ | $p^{10}$ | $p^{0}$ | $p^{13}$ | | ← LAYER 1 |
| $p^{25}$ | $p^{22}$ | $p^{4}$ | $p^{34}$ | $p^{31}$ | $p^{3}$ | $p^{14}$ | $p^{15}$ | $p^{4}$ | $p^{2}$ | $p^{14}$ | $p^{18}$ | $p^{13}$ | $p^{13}$ | $p^{22}$ | $p^{24}$ | ← LAYER 0 |

| COLUMN NUMBER (c) | SHIFT AMOUNT (s) | SHIFT AMOUNT (s1) | SHIFT AMOUNT (s2) |
|---|---|---|---|
| 1 | 29 | 0 | 29 |
| 2 | 22 | 22 | 0 |
| 3 | 0 | 0 | 0 |
| 4 | 34 | 5 | 29 |
| 5 | 31 | 2 | 29 |
| 6 | 22 | 22 | 0 |
| 7 | 14 | 14 | 0 |
| 8 | 4 | 2 | 2 |
| 9 | 4 | 2 | 2 |
| 10 | 28 | 5 | 23 |
| 11 | — | — | — |
| 12 | 27 | 14 | 13 |
| 13 | 13 | 0 | 13 |
| 14 | 23 | 0 | 23 |
| 15 | 22 | 22 | 0 |
| 16 | 24 | 22 | 2 |

FIG. 16B  R = 5/8

| COLUMN NUMBER (c) | SHIFT AMOUNT (s) | SHIFT AMOUNT (s1) | SHIFT AMOUNT (s2) |
|---|---|---|---|
| 1 | 29 | 0 | 29 |
| 2 | 22 | 22 | 0 |
| 3 | 0 | 0 | 0 |
| 4 | 34 | 5 | 29 |
| 5 | 31 | 2 | 29 |
| 6 | 22 | 22 | 0 |
| 7 | 14 | 14 | 0 |
| 8 | 4 | 2 | 2 |
| 9 | 4 | 2 | 2 |
| 10 | 28 | 5 | 23 |
| 11 | — | — | — |
| 12 | 27 | 14 | 13 |
| 13 | 24 | 22 | 2 |
| 14 | 23 | 0 | 23 |
| 15 | 22 | 22 | 0 |
| 16 | 24 | 22 | 2 |

FIG. 16C  R = 3/4

| COLUMN NUMBER (c) | SHIFT AMOUNT (s) | SHIFT AMOUNT (s1) | SHIFT AMOUNT (s2) |
|---|---|---|---|
| 1 | 25 | 2 | 23 |
| 2 | 22 | 22 | 0 |
| 3 | 4 | 2 | 2 |
| 4 | 34 | 5 | 29 |
| 5 | 31 | 2 | 29 |
| 6 | 3 | 22 | 23 |
| 7 | 14 | 14 | 0 |
| 8 | 15 | 2 | 13 |
| 9 | 4 | 2 | 2 |
| 10 | — | — | — |
| 11 | 14 | 14 | 0 |
| 12 | 18 | 5 | 13 |
| 13 | 13 | 0 | 13 |
| 14 | 13 | 0 | 13 |
| 15 | 22 | 22 | 0 |
| 16 | 24 | 22 | 2 |

FIG. 16D  R = 13/16

| COLUMN NUMBER (c) | SHIFT AMOUNT (s) | SHIFT AMOUNT (s1) | SHIFT AMOUNT (s2) |
|---|---|---|---|
| 1 | 25 | 2 | 23 |
| 2 | 22 | 22 | 0 |
| 3 | 4 | 2 | 2 |
| 4 | 34 | 5 | 29 |
| 5 | 31 | 2 | 29 |
| 6 | 3 | 22 | 23 |
| 7 | 14 | 14 | 0 |
| 8 | 15 | 2 | 13 |
| 9 | 4 | 2 | 2 |
| 10 | 2 | 2 | 0 |
| 11 | 14 | 14 | 0 |
| 12 | 18 | 5 | 13 |
| 13 | 13 | 0 | 13 |
| 14 | 13 | 0 | 13 |
| 15 | 22 | 22 | 0 |
| 16 | 24 | 22 | 2 |

| COLUMN NUMBER (c) | SHIFT AMOUNT (s) | SHIFT AMOUNT (s1) | SHIFT AMOUNT (s2) |
|---|---|---|---|
| 1 | 40 | 5 | 35 |
| 2 | 36 | 1 | 35 |
| 3 | 38 | 3 | 35 |
| 4 | 31 | 3 | 28 |
| 5 | 13 | 6 | 7 |
| 6 | 7 | 0 | 7 |
| 7 | 5 | 5 | 0 |
| 8 | 34 | 6 | 28 |
| 9 | 18 | 4 | 14 |
| 10 | 10 | 3 | 7 |
| 11 | 41 | 6 | 35 |
| 12 | — | — | — |
| 13 | — | — | — |

| COLUMN NUMBER (c) | SHIFT AMOUNT (s) | SHIFT AMOUNT (s1) | SHIFT AMOUNT (s2) |
|---|---|---|---|
| 1 | 20 | 6 | 14 |
| 2 | 36 | 1 | 35 |
| 3 | 34 | 6 | 28 |
| 4 | 31 | 3 | 28 |
| 5 | 20 | 6 | 14 |
| 6 | 7 | 0 | 7 |
| 7 | 41 | 6 | 35 |
| 8 | 34 | 6 | 28 |
| 9 | — | — | — |
| 10 | 10 | 3 | 7 |
| 11 | 41 | 6 | 35 |
| 12 | — | — | — |
| 13 | — | — | — |

| COLUMN NUMBER (c) | SHIFT AMOUNT (s) | SHIFT AMOUNT (s1) | SHIFT AMOUNT (s2) |
|---|---|---|---|
| 1 | 35 | 0 | 35 |
| 2 | 19 | 5 | 14 |
| 3 | 41 | 6 | 35 |
| 4 | 22 | 1 | 21 |
| 5 | 40 | 5 | 35 |
| 6 | 41 | 6 | 35 |
| 7 | 39 | 4 | 35 |
| 8 | 6 | 6 | 0 |
| 9 | 28 | 0 | 28 |
| 10 | 18 | 4 | 14 |
| 11 | 17 | 3 | 14 |
| 12 | 3 | 3 | 0 |
| 13 | 28 | 0 | 28 |

| COLUMN NUMBER (c) | SHIFT AMOUNT (s) | SHIFT AMOUNT (s1) | SHIFT AMOUNT (s2) |
|---|---|---|---|
| 1 | — | — | — |
| 2 | — | — | — |
| 3 | — | — | — |
| 4 | — | — | — |
| 5 | — | — | — |
| 6 | — | — | — |
| 7 | — | — | — |
| 8 | — | — | — |
| 9 | — | — | — |
| 10 | — | — | — |
| 11 | — | — | — |
| 12 | — | — | — |
| 13 | — | — | — |

| COLUMN NUMBER (c) | SHIFT AMOUNT (s) | SHIFT AMOUNT (s1) | SHIFT AMOUNT (s2) |
|---|---|---|---|
| 1 | 34 | 4 | 30 |
| 2 | 27 | 3 | 24 |
| 3 | 35 | 5 | 30 |
| 4 | 18 | 0 | 18 |
| 5 | 27 | 3 | 24 |
| 6 | 12 | 0 | 12 |
| 7 | 20 | 2 | 18 |
| 8 | 30 | 0 | 30 |
| 9 | 2 | 2 | 0 |
| 10 | 1 | 1 | 0 |
| 11 | 15 | 3 | 12 |
| 12 | 6 | 0 | 6 |

| COLUMN NUMBER (c) | SHIFT AMOUNT (s) | SHIFT AMOUNT (s1) | SHIFT AMOUNT (s2) |
|---|---|---|---|
| 1 | 30 | 0 | 30 |
| 2 | 27 | 3 | 24 |
| 3 | — | — | — |
| 4 | 18 | 0 | 18 |
| 5 | — | — | — |
| 6 | 12 | 0 | 12 |
| 7 | 20 | 2 | 18 |
| 8 | 14 | 2 | 12 |
| 9 | 2 | 2 | 0 |
| 10 | 25 | 1 | 24 |
| 11 | 15 | 3 | 12 |
| 12 | 6 | 0 | 6 |

| COLUMN NUMBER (c) | SHIFT AMOUNT (s) | SHIFT AMOUNT (s1) | SHIFT AMOUNT (s2) |
|---|---|---|---|
| 1 | 29 | 5 | 24 |
| 2 | 30 | 0 | 30 |
| 3 | 0 | 0 | 0 |
| 4 | 8 | 2 | 6 |
| 5 | 33 | 3 | 30 |
| 6 | 22 | 4 | 18 |
| 7 | 17 | 5 | 12 |
| 8 | 4 | 4 | 0 |
| 9 | 27 | 3 | 24 |
| 10 | 28 | 4 | 24 |
| 11 | 20 | 2 | 18 |
| 12 | 27 | 3 | 24 |
| 13 | 24 | 0 | 24 |
| 14 | 23 | 5 | 18 |

| COLUMN NUMBER (c) | SHIFT AMOUNT (s) | SHIFT AMOUNT (s1) | SHIFT AMOUNT (s2) |
|---|---|---|---|
| 1 | 29 | 5 | 24 |
| 2 | 30 | 0 | 30 |
| 3 | 0 | 0 | 0 |
| 4 | 8 | 2 | 6 |
| 5 | 33 | 3 | 30 |
| 6 | 22 | 4 | 18 |
| 7 | 17 | 5 | 12 |
| 8 | 4 | 4 | 0 |
| 9 | 27 | 3 | 24 |
| 10 | 28 | 4 | 24 |
| 11 | 20 | 2 | 18 |
| 12 | 27 | 3 | 24 |
| 13 | 24 | 0 | 24 |
| 14 | 23 | 5 | 18 |

FIG. 21

--Prior Art--

| | 1st | 2nd | 3rd | 4th | 5th | 6th | 7th | 8th | 9th | 10th | 11th | 12th | 13th | 14th | 15th | 16th |
|---|---|---|---|---|---|---|---|---|---|---|---|---|---|---|---|---|
| FIRST ROW | p35 | p19 | p41 | p22 | p40 | p41 | p39 | p6 | p28 | p18 | p17 | p3 | p28 | 0 | 0 | 0 |
| SECOND ROW | p29 | p30 | p0 | p8 | p33 | p22 | p17 | p4 | p27 | p28 | p20 | p27 | p24 | p23 | 0 | 0 |
| THIRD ROW | p37 | p31 | p18 | p23 | p11 | p21 | p6 | p20 | p32 | p9 | p12 | p29 | 0 | p0 | p13 | 0 |
| FOURTH ROW | p25 | p22 | p4 | p34 | p31 | p3 | p14 | p15 | p4 | 0 | p14 | p18 | p13 | p13 | p22 | p24 |

CM10

--Prior Art--

FIG. 22

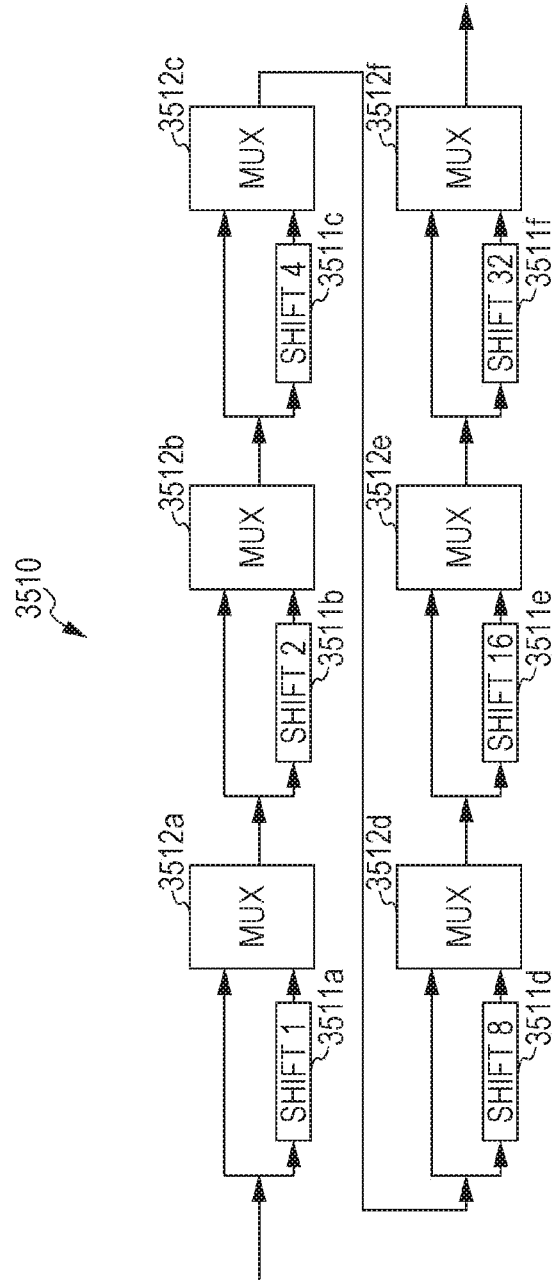
FIG. 24 --Prior Art--

VARIABLE SHIFTER, DECODER, AND DATA SHIFTING METHOD

CROSS REFERENCES TO RELATED APPLICATIONS

This application claims priority to Japanese Patent Application No. 2014-023853, filed on Feb. 10, 2014, the contents of which are hereby incorporated by reference.

BACKGROUND

1. Technical Field

The present disclosure relates to a variable shifter, a decoder, and a data shifting method.

2. Description of the Related Art

Low-density parity-check (LDPC) codes have been known for error-correction encoding methods that can realize bit error rates close to the Shannon limit and that can realize decoders in large scale integration (LSI).

In recent years, among LDPC codes, Quasi-Cyclic LDPC (QC-LDPC) codes with which it is relatively easy to configure encoders have been known. QC-LDPC has been utilized in many industrial fields. QC-LDPC codes are used, for example, in IEEE standard 802.11n used for wireless local area networks (LANs) and in IEEE standard 802.11ad, which is a short-distance wireless communication standard using the 60 GHz band.

Details of the IEEE 802.11ad standard are disclosed in IEEE 802.11ad-2012, 21.3.8, Page 452 (Non-Patent Document 1).

Data encoded with a QC-LDPC code is decoded by an LDPC decoder. For example, a sum-product decoding method, a min-sum decoding method, and a bit-flipping decoding method are known LDPC decoding methods using an LDPC decoder. In any of the decoding methods, barrel shifters shift data, and variable node processing and check node processing are repeated to perform decoding. For example, LDPC decoders applied to high-speed wireless communication perform each of the variable node processing and the check node processing in parallel.

The configuration of an LDPC decoder of the related art is described in Matthew Weiner; Borivoje Nikolic; Zhengya Zhang; "LDPC Decoder Architecture for High-Data Rate Personal-Area Networks" IEEE International Symposium on Circuits and Systems (ISCAS), 2011, Pages 1784-1787 (this document is hereinafter referred to as "Non-Patent Document 2"). Non-Patent Document 2 describes an offset min-sum decoding method, which is one type of min-sum decoding method.

SUMMARY

Since the barrel shifters used in the LDPC decoder of the related art require a large number of selector circuits, the circuit complexity increases, and the power consumption increases. Also, since a large number of selectors are connected in series, the amount of delay in the circuit is large, and it is difficult to realize a high-speed operation.

One non-limiting and exemplary embodiment provides a variable shifter, an LDPC decoder, and a data shifting method that allow a reduction in the circuit complexity and that allow a reduction in the power consumption.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

In one general aspect, the techniques disclosed here feature a variable shifter. The variable shifter includes: a plurality of shifters that cyclically shift input data having a plurality of bits or cyclically shifted data; and a control unit that selects a shift amount for each of the plurality of shifters in accordance with one of a plurality of predetermined cyclic shift amounts. the number of types of the plurality of predetermined cyclic shift amounts is smaller than the number of bits in the input data, each shifter shifts the input data having a plurality of bits or the cyclically shifted data with the selected one of a plurality of shift amounts in accordance with the predetermined cyclic shift amount, and the plurality of shift amounts comprise a combination of shift amounts that differ from one shifter to another.

According to the present disclosure, it is possible to reduce the circuit complexity and the power consumption.

These general and specific aspects may be implemented using a system, a method, and a computer program, and any combination of systems, methods, and computer programs.

BRIEF DESCRIPTION OF THE DRAWINGS

FIG. 3 is a table illustrating a first example of the relationship of shift amounts in the first embodiment;

FIG. 4 is a table illustrating an example of comparison of the circuit complexity between a variable shifter of related art and the variable shifter according to the first embodiment;

FIG. 5 is a table illustrating a second example of the relationship of the shift amounts in the first embodiment;

FIG. 6 is a table illustrating a third example of the relationship of the shift amounts in the first embodiment;

FIG. 8 is a table illustrating one example of the relationship of shift amounts in the second embodiment;

FIG. 11 is a table illustrating a first example of the relationship of a column number of a parity check matrix and shift amounts in the third embodiment;

FIG. 12 is a table illustrating a second example of the relationship of the column number of the parity check matrix and the shift amounts in the third embodiment;

FIG. 13 is a block diagram illustrating a configuration example of an LDPC decoder in a fourth embodiment;

FIG. 14A is a schematic diagram illustrating one example of a parity check matrix for a coding rate of 1/2 in the fourth embodiment, and FIG. 14B is a schematic diagram illustrating one example of a parity check matrix for a coding rate of 5/8 in the fourth embodiment;

FIG. 15A is a schematic diagram illustrating one example of a parity check matrix for a coding rate of 3/4 in the fourth embodiment, and FIG. 15B is a schematic diagram illustrating one example of a parity check matrix for a coding rate of 13/16 in the fourth embodiment;

FIG. 16A is a table illustrating a first example of the relationship of the column number of the parity check matrix and the shift amounts for a coding rate of 1/2 in the fourth embodiment, FIG. 16B is a table illustrating a first example of the relationship of the column number of the parity check matrix and the shift amounts for a coding rate of 5/8 in the fourth embodiment, FIG. 16C is a table illustrating a first example of the relationship of the column number of the parity check matrix and the shift amounts for a coding rate of 3/4 in the fourth embodiment, and FIG. 16D is a table illustrating a first example of the relationship of the column number of the parity check matrix and the shift amounts for a coding rate of 13/16 in the fourth embodiment;

FIG. 18A is a table illustrating a second example of the relationship of the column number of the parity check matrix and the shift amounts for a coding rate of 1/2 in the fourth embodiment, FIG. 18B is a table illustrating a second example of the relationship of the column number of the parity check matrix and the shift amounts for a coding rate of 5/8 in the fourth embodiment, FIG. 18C is a table illustrating a second example of the relationship of the column number of the parity check matrix and the shift amounts for a coding rate of 3/4 in the fourth embodiment, and FIG. 18D is a table illustrating a second example of the relationship of the column number of the parity check matrix and the shift amounts for a coding rate of 13/16 in the fourth embodiment;

FIG. 20A is a table illustrating a third example of the relationship of the column number of the parity check matrix and the shift amounts for a coding rate of 1/2 in the fourth embodiment, FIG. 20B is a table illustrating a third example of the relationship of the column number of the parity check matrix and the shift amounts for a coding rate of 5/8 in the fourth embodiment, FIG. 20C is a table illustrating a third example of the relationship of the column number of the parity check matrix and the shift amounts for a coding rate of 3/4 in the fourth embodiment, and FIG. 20D is a table illustrating a third example of the relationship of the column number of the parity check matrix and the shift amounts for a coding rate of 13/16 in the fourth embodiment;

FIG. 21 is a schematic diagram illustrating one example of a parity check matrix used in IEEE 802.11ad;

FIG. 22 is a schematic diagram illustrating one matrix element of the parity check matrix illustrated in FIG. 21;

FIG. 24 is a block diagram illustrating the configuration of a barrel shifter.

DETAILED DESCRIPTION

Embodiments of the present disclosure will be described below with reference to the accompanying drawings.
(Background that LED to Technology According to Present Disclosure)

Figure 22:
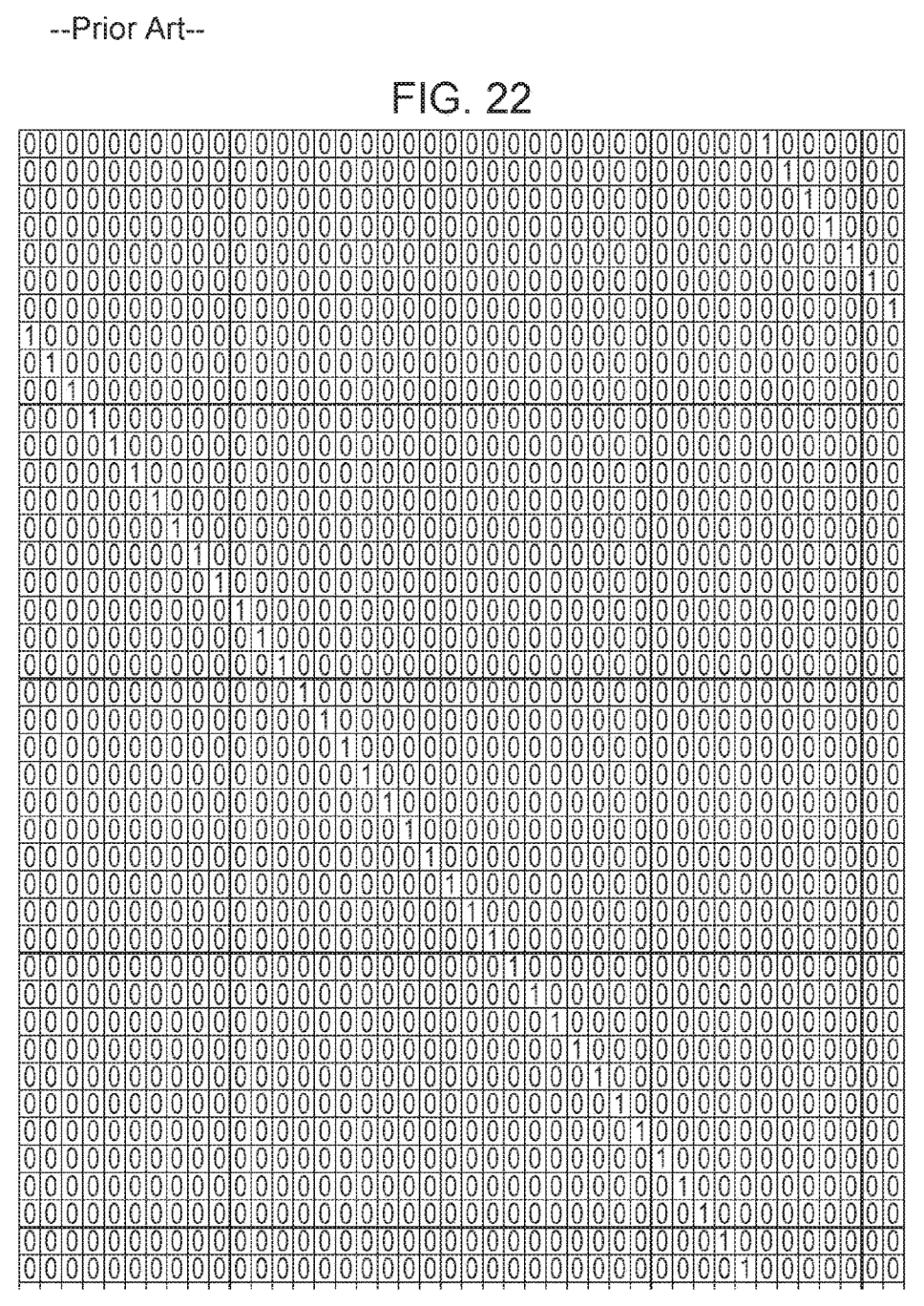

FIG. 21 is a schematic diagram illustrating one example of a parity check matrix CM10 used in IEEE 802.11ad. The parity check matrix CM10 is a matrix of 168 rows and 672 columns, and each element of the parity check matrix CM10 has values of 0 and/or 1. In FIG. 21, "0" represents a zero matrix of 42 rows and 42 columns. $P^n$ (n is an integer 0 to 41) represents a matrix obtained by cyclically shifting a unit matrix of 42 rows and 42 columns in a row direction by an amount corresponding to n columns. FIG. 22 is a schematic diagram illustrating "$P^{35}$". "$P^0$" is a unit matrix.

Since each element of the parity check matrix CM10 represents a matrix of 42 rows and 42 columns, in practice, the parity check matrix CM10 is a matrix of 168 rows and 672 columns. In the following description, for example, a portion including $P^{35}$, $P^{29}$, $P^{37}$, and $P^{25}$ is referred to as a first column, and a portion including $P^{19}$, $P^{30}$, $P^{31}$, and $P^{22}$ is referred to as a second column. Thus, columns up to the 16th column exist in the case in FIG. 21. Similarly, the rows are called a first row to a fourth row.

Next, a description will be given of an LDPC decoder of the related art. The LDPC decoder receives a bit sequence encoded with an LDPC code, performs error correction on the received bit sequence, and estimates transmission information. The transmission information is data before the encoding is performed by the LDPC encoder.

Figure 23:
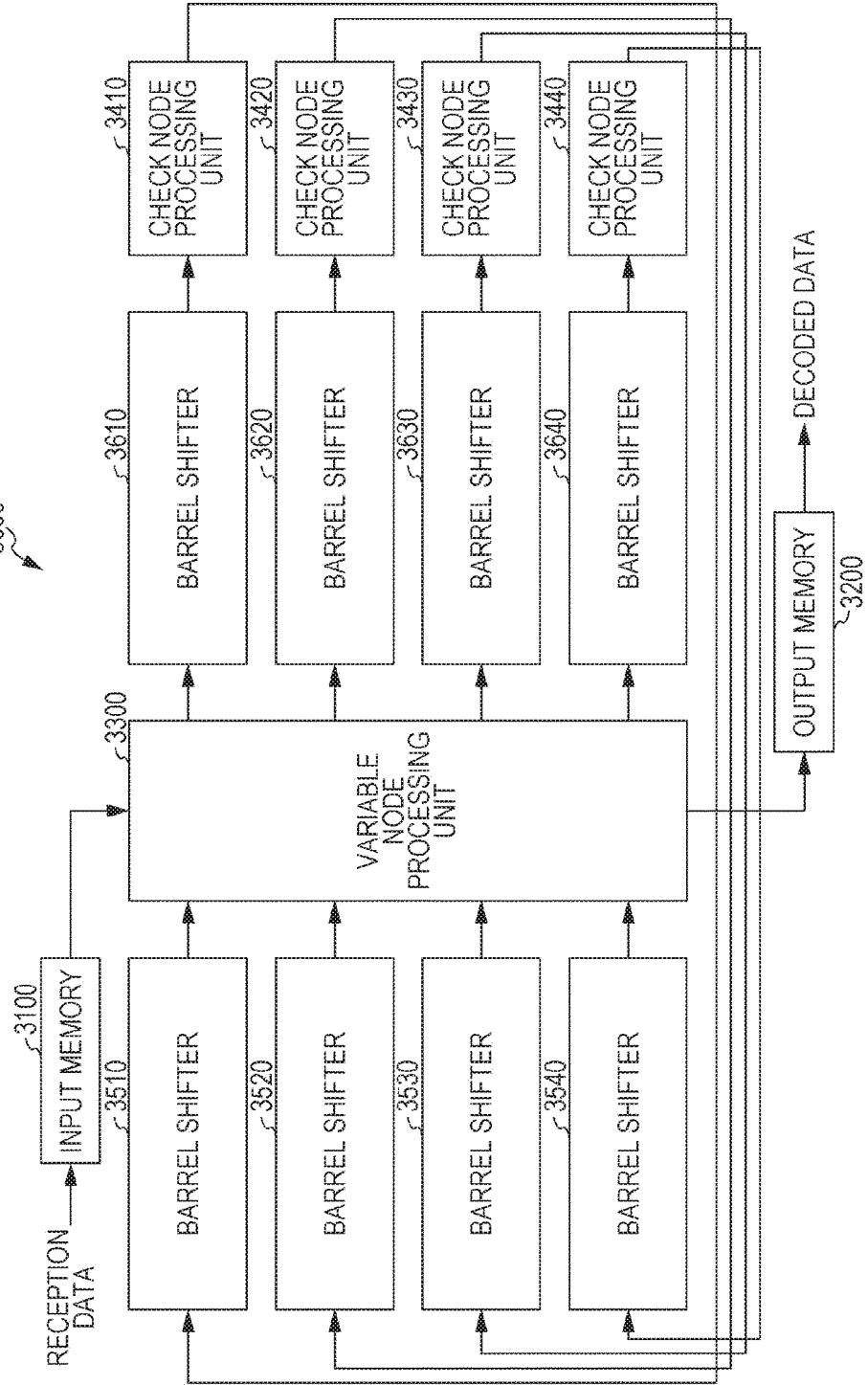
FIG. 23 is a block diagram illustrating the circuit configuration of an LDPC decoder of the related art.

FIG. 23 is a schematic diagram illustrating a circuit configuration of an LDPC decoder of the related art. An LDPC decoder 3000 is a circuit that decodes data encoded with QC-LDPC codes. Each element in a parity check matrix used in this case also has a matrix of 42 rows and 42 columns.

The LDPC decoder 3000 includes an input memory 3100, an output memory 3200, a variable node processing unit 3300, four check node processing units 3410, 3420, 3430, and 3440, and eight barrel shifters 3510, 3520, 3530, 3540, 3610, 3620, 3630, and 3640.

The input memory 3100 stores reception data before error correction (LDPC decoding). The variable node processing unit 3300 perform 42×4 (i.e., 168) variable node processes in parallel. The variable node processing unit 3300 may also rearrange output data.

The check node processing units 3410, 3420, 3430, and 3440 each perform 42 check node processes in parallel. The output memory 3200 stores the results of the LDPC decoding, that is, output data of the LDPC decoder 3000.

Each of the barrel shifters 3510, 3520, 3530, 3540, 3610, 3620, 3630, and 3640 cyclically shifts 42 pieces of input data and outputs the resulting data in order to deal with elements included in the matrix of 42 rows and 42 columns.

In order to deal with LDPC codes other than QC-LDPC codes, a more complicated rearrangement circuit, instead of the barrel shifters, may also be used depending on the parity check matrix.

FIG. 24 is a schematic diagram illustrating details of the configuration of the barrel shifter 3510. The barrel shifter 3510 includes six fixed shifters 3511a, 3511b, 3511c, 3511d, 3511e, and 3511f and six multiplexers (MUXs) 3512a, 3512b, 3512c, 3512d, 3512e, and 3512f.

The six fixed shifters 3511a, 3511b, 3511c, 3511d, 3511e, and 3511f perform cyclic shifts of "1", "2", "4", "8", "16", and "32", respectively, on 42 pieces of data that are input. In the drawings (e.g., FIG. 24), "SHIFT n" (n is an integer) represents a shifter which performs a cyclic shift of "n".

Each of the multiplexers 3512a to 3512f selects either 42 pieces of non-shifted data or 42 pieces of shifted data. Each of the multiplexer 3512a to 3512f is a two-input multiplexer and has a configuration including 42 two-input and one-output selector circuits. That is, the barrel shifter 3510 has a configuration including 252 selector circuits.

The barrel shifter 3510 can shift 42 pieces of input data by an arbitrary number of 0 to 41.

For example, in order to perform a shift of "19" ("shift 19"), the multiplexers 3512a, 3512b, and 3512e select 42 pieces of shifted data, and the other multiplexers 3512c, 3512d, and 3512f select 42 pieces of non-shifted data.

Since the LDPC decoder of the related art illustrated in FIG. 23 requires eight barrel shifters, it requires 252×8 (i.e., 2016) selector circuits. Thus, since the LDPC decoder of the related requires a large number of selector circuits, the circuit complexity increases, and the power consumption increases.

A description will be given below of a variable shifter, an LDPC decoder, and a data shifting method that can reduce the circuit complexity and can thus reduce the power consumption.

A variable shifter in the embodiment described below has, for example, a function for shifting data by an amount corresponding to a specified number of shifts and includes shifters for use in an LDPC encoder and LDPC decoder. The variable shifter may also be used for, for example, an error correction encoder that handles error correction other than the above-described LDPC, an error correction decoder, a cryptographic circuit, or a circuit that performs an algebraic operation.

The LDPC decoder in the embodiment described below has, for example, a function for decoding data encoded with LDPC codes in which submatrices indicating cyclic shifts are included in a parity check matrix. The LDPC decoder is used, for example, for a receiver for wireless communication. The LDPC decoder may also perform, for example, error correction on a disk drive or a memory medium.

First Embodiment

Figure 1:
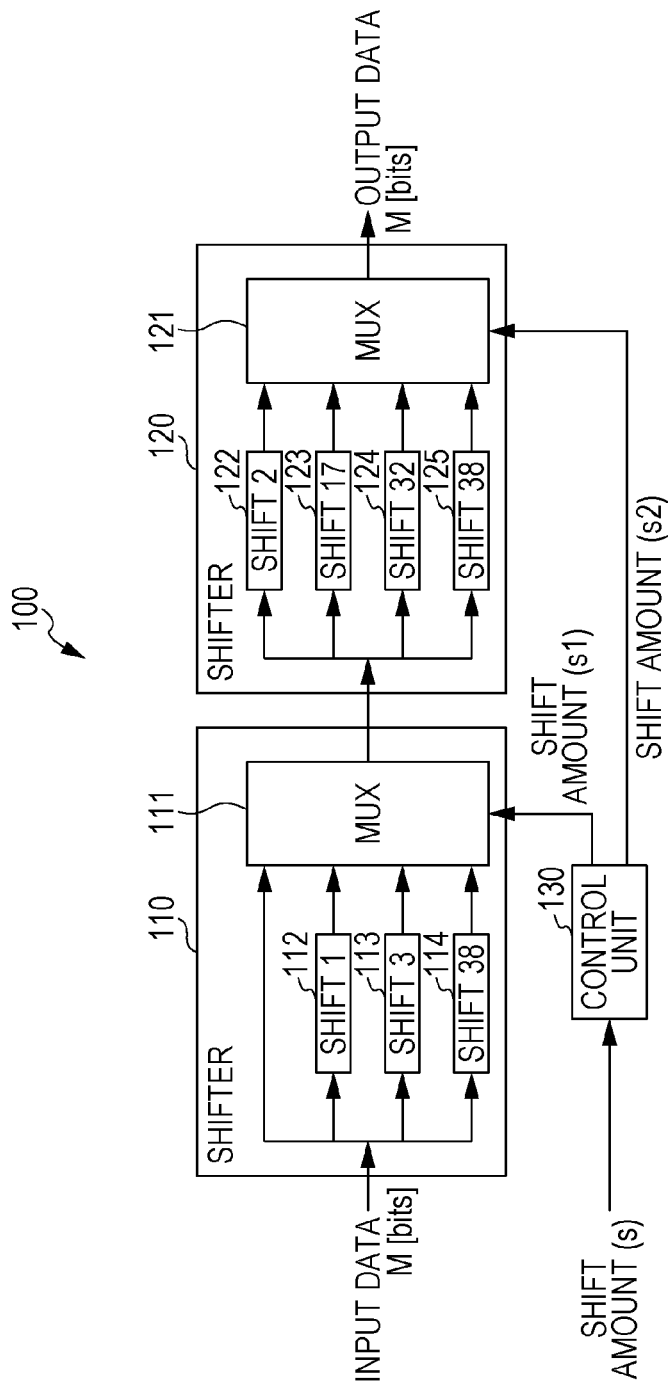
FIG. 1 is a block diagram illustrating a configuration example of a variable shifter according to a first embodiment.

FIG. 1 is a block diagram illustrating a configuration example of a variable shifter 100 according to a first embodiment. The variable shifter 100 has a configuration including shifters 110 and 120 and a control unit 130. The shifter 110 includes a multiplexer 111 and fixed shifters 112, 113, and 114. The shifter 120 includes a multiplexer 121 and fixed shifters 122, 123, 124, and 125.

The variable shifter 100 performs bit shifting on input data of M bits (e.g., 42 bits) by an amount corresponding to a specified shift amount s and outputs the bit-shifted data. "M" is one example of the number of data elements in the input data. The shift amount s is specified by, for example, one portion (which is not illustrated in the present embodiment and corresponds to, for example, a control unit 1700 described below and illustrated in FIG. 9) in the LDPC decoder. The variable shifter 100 can vary the shift amount s.

The shifter 110 shifts the M-bit input data by using a shift amount s1 specified by the control unit 130 and outputs the shifted data. The shifter 120 re-shifts the M-bit data from the shifter 110 by using a shift amount s2 specified by the control unit 130 and outputs the re-shifted data. The shift amounts s1 and s2 are specified by the control unit 130. In the shifter 110 illustrated in FIG. 1, a description will be given assuming that, even when the shift amount s1 is "0", the corresponding data is shifted data.

The shift amount s is one example of an input shift amount. The shift amount s1 is one example of a first shift amount, and the shift amount s2 is one example of a second shift amount. The shifter 110 is one example of a first shifter. The shifter 120 is one example of a second shifter.

The fixed shifters 112, 113, and 114 cyclically shift the input M-bit data by using "1", "3", and "38", respectively. The fixed shifters 122, 123, 124, and 125 cyclically shift the input M-bit data by using "2", "17", "32", and "38", respectively.

The multiplexer 111 selects one of non-shifted M-bit data and three types of shifted M-bit data. The three types of shifted M-bit data include, for example, shift 1, shift 3, and shift 38. The non-shifted M-bit data means the same as data with a shift amount of 0. Herein, the shift amounts 0, 1, 3, and 38 are referred to as "elements of the shift amount s1".

The multiplexer 121 selects one of four types of shifted M-bit data. The four types of shifted M-bit data include, for example, shift 2, shift 17, shift 32, and shift 38. Herein, the shift amounts 2, 17, 32, and 38 are referred to as "elements of the shift amount s2".

In FIG. 1, each of the multiplexers 111 and 121 is a four-input multiplexer and has a configuration including M (e.g., 42) four-input and one-output selector circuits.

Figure 2:
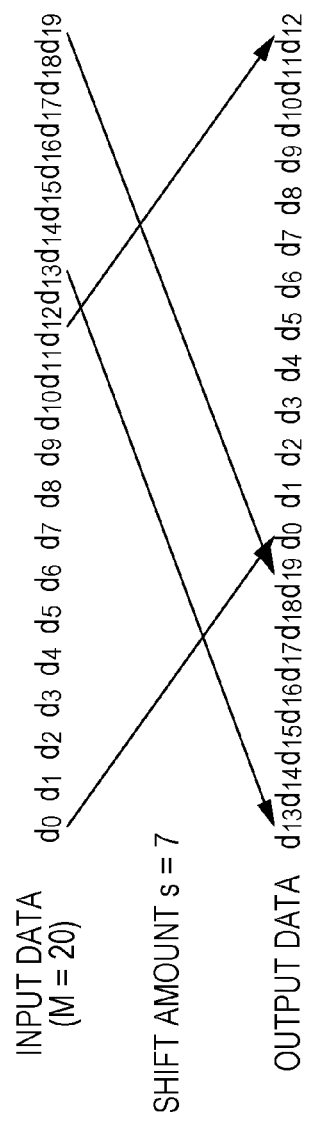
FIG. 2 is a schematic diagram illustrating a concept of shifting in the first embodiment.

FIG. 2 is a schematic diagram illustrating the concept of shifting performed by the variable shifter 100. In FIG. 2, the size M of the input data is 20 bits, and the specified shift amount s is 7. A zeroth data bit d0 of the input data is moved, by shifting, seven positions to the right in FIG. 2. Similarly, data bits d1 to d12 are moved seven positions to the right. Seven data bits d13 to d19 are cyclically moved to the front end position.

The values that can be taken by the shift amount s are integers that are 0 or more and that are less than M. In a variable shifter of the related art (e.g., the barrel shifter disclosed in Non-Patent Document 2), integers that are 0 or more and that are less than M, that is, M different integers, are specified as the values of the shift amount s. In the variable shifter 100, on the other hand, it is pre-defined that the shift amount s takes K values (K different values) of integers that are 0 or more and that are less than M. "K" is an integer that is 2 or more and that is less than M and represents the types of shift amount s (the number of patterns).

Next, a description will be given of an operation example of the control unit 130.

FIG. 3 is a table illustrating a first example of the relationship of the shift amounts s, s1, and s2 in the present embodiment when the size M of the input data is 42 bits. In FIG. 3, there are 16 different values of the shift amount s listed in the first column (the leftmost column) in FIG. 3.

The value of the variable K and the 16 different values of the shift amount s are pre-defined depending on the application of the variable shifter. The values illustrated in FIG. 3 are values defined based on an LDPC code matrix defined by the aforementioned IEEE standard 802.11ad. The shift amounts s in FIG. 3 are illustrated as merely examples, and values different from those illustrated in FIG. 3 may also be used depending on the application of the variable shifter. The parity check matrix is also shared by an LDPC encoding device (not illustrated).

That is, the value of the variable K in FIG. 3 is 16. By using the input shift amount s, the control unit 130 determines two shift amounts s1 and s2, for example, in accordance with the table in FIG. 3. For example, for s=2, the control unit 130 determines s1=0 and s2=2.

With respect to the value of the pre-defined shift amount s, the control unit 130 determines values that satisfy equation 1 below as the values of the shift amounts s1 and s2.

$$s = (s1 + s2) \bmod M \quad \text{(equation 1)}$$

where "mod" indicates the modulus operator.

In this case, when the shift amount s is 13, the shift amount s1 is 38 and the shift amount s2 is 17. Thus, (38+17) mod 42=13 is obtained, which satisfies equation 1.

Upon determining the values of the shift amounts s1 and s2, the control unit 130 controls the shifters 110 and 120 in accordance with the shift amounts s1 and s2. In FIG. 3, since it can be determined from equation 1 that the values that can be taken by the shift amount s1 are four different values 0, 1, 3, and 38, the shifter 110 performs shift processing for one of the shift amounts 0, 1, 3, and 38. The values that can be taken by the shift amount s1, the values being illustrated in FIG. 3, are one example of a shift-amount set including a plurality of shift amounts and are one example of a first shift-amount set defined by M and the variable K.

The multiplexer 111 selects one of the pieces of output data of the fixed shifters 112, 113, and 114 and the input data and outputs the selected data. For example, for s1=0, the multiplexer 111 selects the input data, and for s1=1, the multiplexer 111 selects the output data of the fixed shifter 112.

Similarly, in FIG. 3, it can be determined that the values that can be taken by the shift amount s2 are four different values 2, 17, 32, and 38. The values that can be taken by the shift amount s2 are one example of a shift-amount set including a plurality of shift amounts and are one example of a second shift-amount set.

Next, a comparison will be made between the variable shifter (barrel shifter) illustrated in FIG. 24 and the variable shifter 100 according to the present embodiment.

FIG. 4 is a table illustrating an example of comparison of the circuit complexity between the barrel shifter 3510 illustrated in FIG. 24 and the variable shifter 100 according to the present embodiment. In this case, the circuit complexity of an M-bit two-input multiplexer is represented by "X", and comparison is made with a relative circuit complexity.

Since the barrel shifter 3510 requires six stages of the M-bit two-input multiplexers 3512a to 3512f, the relative circuit complexity is "6X". On the other hand, the variable shifter 100 requires two stages of the M-bit four-input multiplexers 111 and 121. Since each of the M-bit four-input multiplexers 111 and 121 has twice the circuit complexity of an M-bit two-input multiplexer, the relative circuit complexity of the variable shifter 100 according to the present embodiment is "4X".

Thus, the circuit complexity of the variable shifter 100 is about 33% smaller than that of the barrel shifter 3510. Since the circuit complexity is smaller, the power consumption also decreases.

In the barrel shifter 3510, the multiplexers 3512a to 3512f are connected in series in six stages. On the other hand, in the variable shifter 100, the multiplexers 111 and 121 are connected in series in two stages, which are fewer than the six stages. Accordingly, the variable shifter 100 can operate at higher speed than the barrel shifter 3510.

Since the variable shifter 100 can operate at high speed, the operating frequency of an LSI for the variable shifter 100 can be set higher than that for the barrel shifter 3510, thus making it possible to achieve high throughput. The drive voltage of LSI for the variable shifter 100 can also be set lower than that for the barrel shifter 3510, thus making it possible to reduce the power consumption.

Thus, the variable shifter 100 determines two shift amounts s1 and s2 for the shift amount s. The variable shifter 100 includes the shifter 110 that performs shifting for the shift amount s1 and the shifter 120 that performs shifting for the shift amount s2.

According to the variable shifter 100, since it is possible to perform shifting by controlling a combination of the pre-defined shift amount s1 and the pre-defined shift amount s2, the shifting can be performed according to the input shift amount s. Also, by limiting the types (variable K) of shift amount s, it is also possible to reduce the number of elements of the shift amounts s1 and s2 to a number smaller than the number of elements of the input data, thus making it possible to reduce the number of selector circuits in the cyclic shifter circuit. Accordingly, the circuit complexity of the variable shifter 100 can be reduced, the power consumption of the variable shifter 100 can be reduced, and the variable shifter 100 can operate at high speed.

The above description in the present embodiment has been mainly given of an example in which the values of the shift amounts s1 and s2 are the values illustrated in FIG. 3, the values of the shift amounts s1 and s2 may be other values that satisfy equation 1. FIG. 5 is a table illustrating a second example of the relationship of the shift amounts s, s1, and s2.

Although the above description in the present embodiment has been mainly given of an example in which the values taken by the shift amount s are the 16 values illustrated in the first column in FIG. 3, other values may also be used. K is not limited to 16, and the value of K may be another value in the range of 2 to less than M. FIG. 6 is a table illustrating a third example of the relationship of the shift amounts s, s1, and s2.

Although the above description in the present embodiment has been mainly given of an example in which the input data is M-bit data, the input data may be, for example, M pieces of word data, M likelihood values, or M sequences of digital signals.

Second Embodiment

Figure 7:
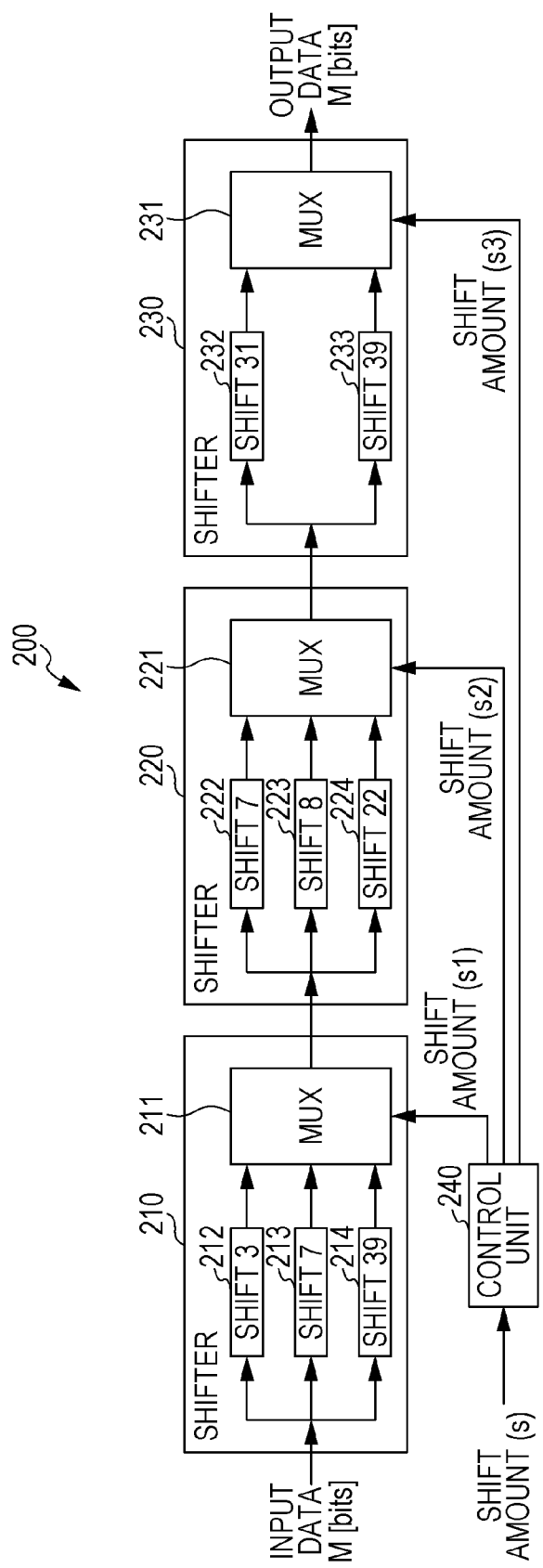
FIG. 7 is a block diagram illustrating a configuration example of a variable shifter according to a second embodiment.

FIG. 7 is a block diagram illustrating a configuration example of a variable shifter 200 according to a second embodiment. The variable shifter 200 has a configuration including shifters 210, 220, and 230 and a control unit 240. The shifter 210 includes a multiplexer 211 and fixed shifters 212, 213, and 214. The shifter 220 includes a multiplexer 221 and fixed shifters 222, 223, and 224. The shifter 230 includes a multiplexer 231 and fixed shifters 232 and 233.

The shifter 210 shifts input data of M bits (e.g., 42 bits) by using a shift amount s1 specified by the control unit 240 and outputs the shifted data. The shifter 220 re-shifts the M-bit data from the shifter 210 by using a shift amount s2 specified by the control unit 240 and outputs the shifted data. The shifter 230 re-shifts the M-bit data from the shifter 220 by using a shift amount s3 specified by the control unit 240 and outputs the shifted data. The shift amounts s1, s2, and s3 are specified by the control unit 240.

The fixed shifters 212, 213, and 214 cyclically shift the input M-bit data by using shift amounts "3", "7", and "39", respectively. The fixed shifters 222, 223, and 224 cyclically shift the input M-bit data by using shift amounts "7", "8", and "22", respectively. The fixed shifters 232, and 233 cyclically shift the input M-bit data by using shift amounts "31", and "39", respectively.

The multiplexer 211 is a three-input multiplexer and selects M-bit data shifted by one of the three types of shift processing. In the three types of shift processing, for example, the elements of the shift amount s1 include shift 3, shift 7, and shift 39.

The multiplexer 221 is a three-input multiplexer and selects M-bit data shifted by one of the three types of shift processing. In the three types of shift processing, for example, the elements of the shift amount s2 include shift 7, shift 8, and shift 22.

The multiplexer 231 is a two-input multiplexer and selects M-bit data shifted by one of the two types of shift processing. In the two types of shift processing, for example, the elements of the shift amount s3 include shift 31 and shift 39.

In FIG. 7, each of the multiplexers 211 and 221 includes M (e.g., 42) three-input and one-output selector circuits. The multiplexer 231 includes M two-input and one-output selector circuits.

Next, a description will be given of an operation example of the control unit 240.

FIG. 8 is a table illustrating a first example of the relationship of the shift amounts s, s1, s2, and s3 in the present embodiment. In the table in FIG. 8, the possible shift amounts s are the 17 different values listed in the first column. That is, the value of the variable K is 17. By using an input shift amount s, the control unit 240 determines the three shift amounts s1, s2, and s3, for example, in accordance with the table in FIG. 8. For example, for s=0, the control unit 240 determines s1=3, s2=8, and s3=31 in accordance with equation 2 below.

With respect to the value of the pre-defined shift amount s, the control unit 240 determines values that satisfy equation 2 below as the values of the elements of the shift amounts s1, s2, and s3.

$$s = (s1 + s2 + s3) \bmod M \quad \text{(equation 2)}$$

In this case, when the shift amount s is 16, the shift amount s1 is 39, the shift amount s2 is 22, and the shift amount s3 is 39. Thus (39+22+39) mod 42=16 is obtained, which satisfies equation 2.

Upon determining the values of the elements of the shift amounts s1, s2, and s3, the control unit 240 controls the shifters 210, 220, and 230 in accordance with the shift amounts s1, s2, and s3. In FIG. 8, since it can be determined according to equation 2 that the values of the elements that can be taken by the shift amount s1 are three different values 3, 7, and 39, the shifter 210 performs shift processing for one of the shift amounts 3, 7, and 39. The multiplexer 211 selects one of the outputs of the fixed shifters 212, 213, and 214 and outputs the selected output.

Similarly, in FIG. 8, since it can be determined according to equation 2 that the values of the elements that can be taken by the shift amount s2 are three different values 7, 8, and 22, the shifter 220 performs shift processing for one of the shift amounts 7, 8, and 22.

Also, since it can be determined that the values of the elements that can be taken by the shift amount s3 are two different values 31 and 39, the shifter 230 performs shift processing for one of the shift amounts 31 and 39.

As described above, the variable shifter 200 determines the three shift amounts s1, s2, and s3 for the shift amount s. The variable shifter 200 includes the shifter 210 that performs shifting for the shift amount s1, the shifter 220 that performs shifting for the shift amount s2, and the shifter 230 that performs shifting for the shift amount s3.

Since the variable shifter 200 can limit the shift amounts s1, s2, and s3 that can be taken by the respective shifters 210, 220, and 230, the circuit complexity and the power consumption of the variable shifter 200 can be reduced, and the variable shifter 200 can operate at high speed.

Compared with the variable shifter 100 described above, the variable shifter 200 has a larger number of shifters and thus has a larger amount of delay, but has a smaller number of inputs to each multiplexer and thus allows a reduction in the circuit complexity. Accordingly, for example, when the number (M) of bits of the input data is large or when the number (K) of shift amounts is large, the variable shifter 200 is useful.

Third Embodiment

In a third embodiment, a description will be given of an LDPC decoder including a variable shifter that is equivalent to the variable shifter 100 or 200. The LDPC decoder decodes data (digital signals) encoded using LDPC codes. The LDPC codes are one example of linear codes.

Figure 9:
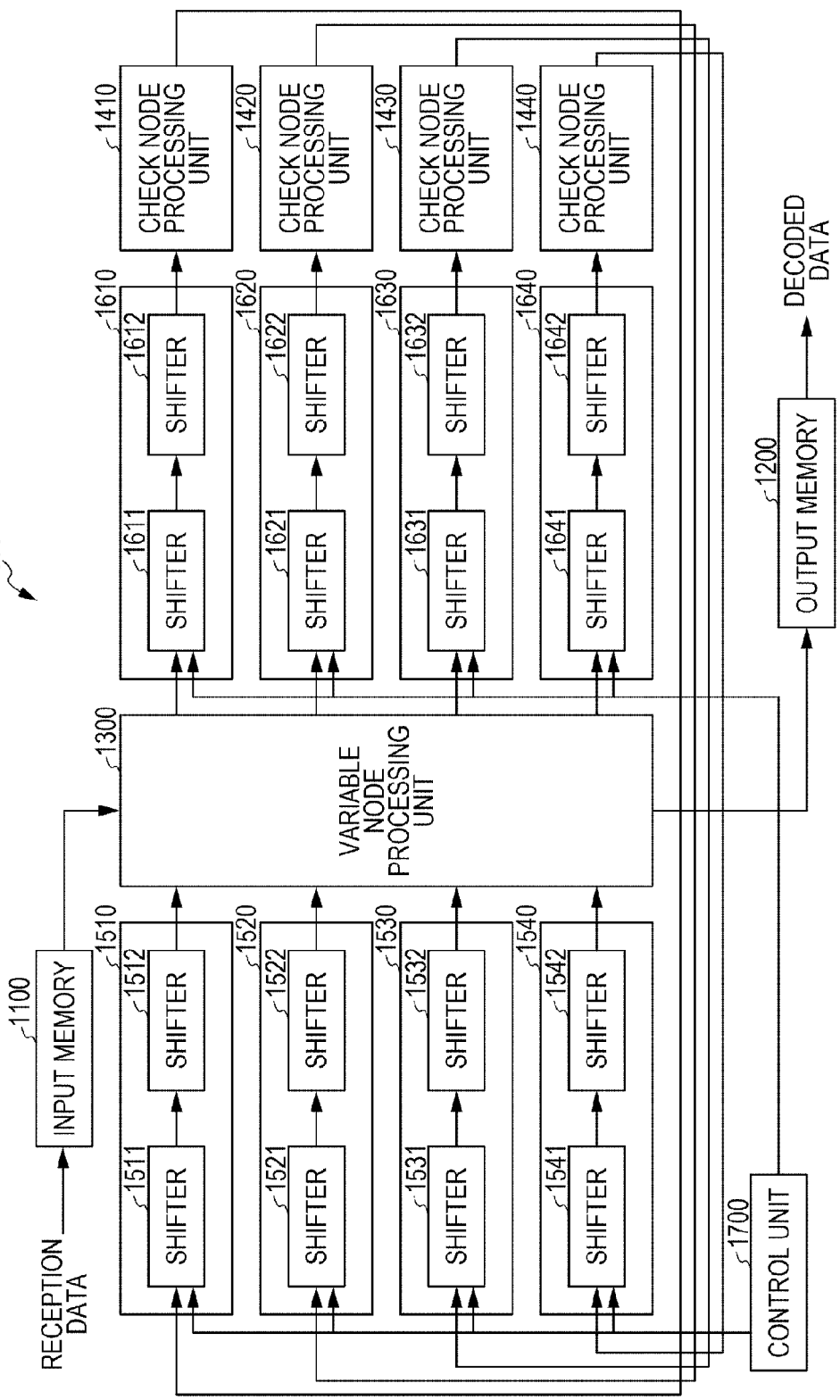
FIG. 9 is block diagram illustrating a configuration example of an LDPC decoder in a third embodiment.

FIG. 9 is a block diagram illustrating a configuration example of an LDPC decoder 1000 in the third embodiment. The LDPC decoder 1000 decodes original data from data encoded based on the parity check matrix CM10 (see FIG. 21). For example, the LDPC decoder 1000 performs computations for 42 columns in the parity check matrix CM10 at each point in time (i.e., in each clock cycle) in parallel, based on the min-sum decoding method. In the present embodiment, the min-sum decoding method will be mainly described as an example of a decoding scheme for the LDPC decoding.

The LDPC decoder 1000 has a configuration including an input memory 1100, an output memory 1200, a variable node processing unit 1300, check node processing units 1410, 1420, 1430, and 1440, variable shifters 1510, 1520, 1530, and 1540, variable shifters 1610, 1620, 1630, and 1640, and a control unit 1700.

The input memory 1100 holds data input to the LDPC decoder 1000 and supplies necessary data to the variable node processing unit 1300 in accordance with an LDPC decoding operation.

The output memory 1200 holds data of a decoding result of the LDPC decoding, the decoding result being output from the variable node processing unit 1300.

The input memory 1100 may even be omitted so long as data can be input. The output memory 1200 may even omitted so long as data can be output.

By using data output from the input memory 1100 and data output from the variable shifters 1510, 1520, 1530, and 1540, the variable node processing unit 1300 performs variable node processes based on the min-sum decoding method. The variable node processes are known computations and correspond to, for example, the computation in equation 3 noted in Non-Patent Document 2. The variable node processing is also called column processing.

$$\beta_{mn} = \sum_{m' \in A(n) \backslash n} \alpha_{m'n} + \lambda_m \quad \text{(equation 3)}$$

By using data output from the variable shifters 1610, 1620, 1630, and 1640, the check node processing units 1410, 1420, 1430, and 1440 perform check node processes based on the min-sum decoding method. The check node processes are known computations and correspond to, for example, the computation in equation 4 noted in Non-Patent Document 2. The check node processing is also called row processing.

$$\alpha_{mn} = \max\left\{\min_{n' \in A(m) \backslash n} |\beta_{mn'}| - \beta, 0\right\} \cdot \prod_{n' \in A(m) \backslash n} \text{sign}(\beta_{mn'}) \quad \text{(equation 4)}$$

In this case, $\alpha_{mn}$ and $\beta_{mn}$ calculated from equations 3 and 4 are called messages and are hereinafter referred to simply as "data". "β" in equation 4 is an offset value used in the offset Min-Sum decoding method. $\lambda_n$ in equation 3 is a log-likelihood ratio input to the LDPC decoder and is hereinafter referred to as "reception data". A(m) represents a set of column indexes in which 1 is set in the mth row in the parity check matrix. B(n) represents a set of row indexes in which 1 is set in the nth column in the parity check matrix.

The LDPC decoder 1000 decodes original data from input data which is encoded with an LDPC code, based on the parity check matrix CM10. A column number c of the parity check matrix CM10 represents a column to be processed by LDPC decoding at each point in time. For example, the leftmost column (the columns for $P^{35}$, $P^{29}$, $P^{37}$, and $P^{25}$) in the parity check matrix CM10 is a first column and has a column number "1". As the time passes, the column number c is incremented, so that the column to be processed shifts to a right column in the parity check matrix CM10.

Different rows with the same column number c in the parity check matrix CM10 are rows on which the processing is to be performed in parallel. For example, the variable shifter 1510 performs processing on a first row (e.g., the uppermost row) in the parity check matrix CM10. The variable shifter 1520 performs processing on a second row in the parity check matrix CM10. The variable shifter 1530 performs processing on a third row in the parity check matrix CM10. The variable shifter 1540 performs processing on a fourth row in the parity check matrix CM10.

The variable shifters 1510, 1520, 1530, and 1540 perform shift processing on data output from the check node processing units 1410, 1420, 1430, and 1440, respectively. That is, the variable shifters 1510, 1520, 1530, and 1540 shift data output from the check node processing units 1410, 1420, 1430, and 1440, respectively. For example, the shift amount s for shift processing performed by the variable shifter 1510 is specified according to the procedure described below.

First, the control unit 1700 uses a timer (e.g., a real time clock (RTC)), not illustrated) to specify the column number c to be processed at each point in time. The variable shifter 1510 determines the shift amount s in accordance with the values in the first row in the parity check matrix CM10 and the column number c specified by the control unit 1700.

For example, when the column number c specified by the control unit 1700 indicates the first column (c=1) illustrated in FIG. 21, the variable shifter 1510 determines that the shift amount s is "35" by referring to the first row and the first column in the parity check matrix CM10 and performs data shift processing.

Also, for example, when the column number c specified by the control unit 1700 indicates the fifth column illustrated in FIG. 21, the variable shifter 1510 determines that the shift amount s is "40" by referring to the first row and the fifth column in the parity check matrix CM10.

Also, for example, when the column number c specified by the control unit 1700 is the 16th column illustrated in FIG. 11, the variable shifter 1510 determines that the shift amount s is "0", since the first row and the 16th column in the parity check matrix CM10 indicate a zero matrix. Thus, the variable shifter 1510 does not perform any operation or outputs a value 0.

Similarly, the variable shifter 1520 determines the number of shifts by referring to the second row in the parity check matrix CM10. The variable shifter 1530 determines the number of shifts by referring to the third row in the parity check matrix CM10. The variable shifter 1540 determines the number of shifts by referring to the fourth row in the parity check matrix CM10.

The variable shifters 1610, 1620, 1630, and 1640 perform shift processing on data output from the variable node processing unit 1300. Similarly to the variable shifters 1510, 1520, 1530, and 1540, the variable shifters 1610, 1620, 1630, and 1640 determine the shift amounts s in accordance with the values in the respective first, second, third, and fourth rows, respectively, in the parity check matrix CM10 and the column number c specified by the control unit 1700.

However, the variable shifters 1610, 1620, 1630, and 1640 shift the data in directions opposite to those in the variable shifters 1510, 1520, 1530, and 1540. For example, the variable shifter 1510 shifts the data to the right, and the variable shifter 1610 shifts the data to the left.

Next, a configuration example and an operation example of the variable shifter 1510 will be described in detail.

Figure 10:
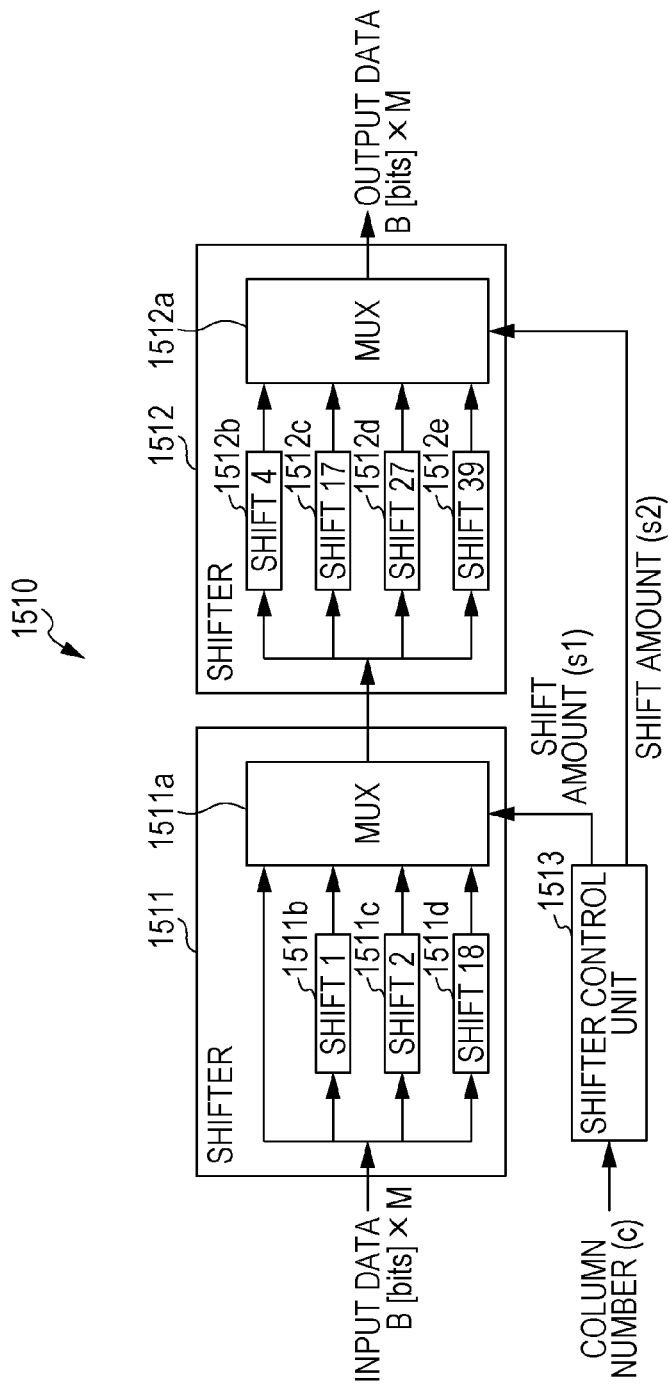
FIG. 10 is a block diagram illustrating a configuration example of a variable shifter in the third embodiment.

FIG. 10 is a block diagram illustrating a configuration example of the variable shifter 1510. The variable shifter 1510 includes shifters 1511 and 1512 and a shifter control unit 1513. The shifter 1511 includes fixed shifters 1511b, 1511c, and 1511d and a multiplexer 1511a. The shifter 1512 includes fixed shifters 1512b, 1512c, 1512d, and 1512e and a multiplexer 1512a.

Compared with the shifter 110 illustrated in FIG. 1, the shifter 1511 has a similar configuration, operates in a similar manner, and uses different shift amounts. Compared with the shifter 120 illustrated in FIG. 1, the shifter 1512 has a similar configuration, operates in a similar manner, and uses different shift amounts.

The shifter control unit 1513 determines two shift amounts s1 and s2 in accordance with the column number c specified by the control unit 1700. Thus, the shifter control unit 1513 corresponds to, for example, the control unit 130 in the variable shifter 100.

FIG. 11 is a table illustrating one example of a rule for determining the shift amounts s1 and s2 in the shifter control unit 1513. With respect to the column number c listed in the first column (the leftmost column) in FIG. 11, the shifter control unit 1513 generates corresponding shift amounts s1 and s2 in the third and fourth columns. In the second column in the table in FIG. 11, the shift amounts s are listed for the sake of explanation. By referring to the parity check matrix CM10, the control unit 1700 specifies the shift amount s with respect to each column number c.

As in the first embodiment, the shifter control unit 1513 can determine the shift amounts s1 and s2 that satisfy equation 1 noted above. Thus, the table in FIG. 11 is determined according to the first row in the parity check matrix CM10 for LDPC codes. It can be understood from the table in FIG. 11 that the shifter 1511 selects one of "0, 1, 2, and 18" as the shift amounts s1 for each column number c, and the shifter 1512 selects one of "4, 17, 27, and 39" as the shift amounts s2 for each column number c. Details of the variable shifter 1510 can be designed in accordance with the table illustrated in FIG. 11.

Similarly, a configuration example and an operation example of the variable shifter 1520 are based on a table illustrated in FIG. 12. The table in FIG. 12 is determined according to the second row in the parity check matrix CM10. It can be understood from the table in FIG. 12 that a shifter 1521 illustrated in FIG. 9 selects one of "0, 1, 5, and 31" as the shift amounts s1 for each column number c, and a shifter 1522 selects one of "19, 22, 28, and 41" as the shift amounts s2 for each column number c. Details of the variable shifter 1520 can be designed in accordance with the table illustrated in FIG. 12.

Similarly, by referring to the parity check matrix CM10, it is possible to determine the shift amounts s1 and s2 corresponding to the column number c and it is possible to determine configurations and operations of the variable shifters 1530, 1540, 1610, 1620, 1630, and 1640.

To this end, in the LDPC decoder 1000, two shifter circuits (e.g., the shifters 1511 and 1512) are connected in series, and the shift amounts s1 and s2 defined based on the parity check matrix CM10 for LDPC codes are used to perform LDPC decoding.

According to the LDPC decoder 1000, since the shift amounts s1 and s2 that can be taken by the shifters in the two shifter circuits are limited in accordance with the column number c of the parity check matrix CM10, it is possible to reduce the number of selector circuits in the cyclic shifter circuit. Accordingly, since the circuit complexity of the two shifter circuits is reduced, the circuit complexity and the power consumption of the LDPC decoder 1000 can be reduced, and the LDPC decoder 1000 can operate at high speed.

The above description in the present embodiment has been given of an example in which one of the variable shifters 1510, 1520, 1530, 1540, 1610, 1620, 1630, and 1640 corresponds to one row in the parity check matrix CM10, and the shift amounts s, s1, and s2 are determined in accordance with the column number c.

For example, one of the variable shifters 1510, 1520, 1530, 1540, 1610, 1620, 1630, and 1640 may correspond to one column in the parity check matrix CM10, and the shift amounts may be determined in accordance with the row number.

One of the variable shifters 1510, 1520, 1530, 1540, 1610, 1620, 1630, and 1640 may also correspond to particular two rows or particular two columns, rather than one row or one column in the parity check matrix CM10. Also, the correspondences between the matrix elements of the parity check matrix CM10 and the variable shifters may be arbitrarily defined, rather than the correspondence using a unit of rows or columns of the parity check matrix CM10. The column number c, the row number, and the matrix elements in the parity check matrix CM10 are examples of an area to be processed in a parity check matrix.

Fourth Embodiment

A fourth embodiment is a modification of the third embodiment. In the fourth embodiment, an LDPC decoder takes a coding rate R into account to decode data (digital signals) encoded using LDPC codes.

FIG. 13 is a block diagram illustrating a configuration example of an LDPC decoder 2000 in the fourth embodiment. In the LDPC decoder 2000, portions that are the same as or similar to those in the LDPC decoder 1000 illustrated in FIG. 9 are denoted by the same reference numerals, and descriptions of redundant portions are omitted or are briefly given.

The LDPC decoder 2000 has a configuration including an input memory 1100, an output memory 1200, a variable node processing unit 1300, check node processing units 1410, 1420, 1430, and 1440, variable shifters 2510, 2520, 2530, and 2540, variable shifters 2610, 2620, 2630, and 2640, and a control unit 2700.

The LDPC decoder 2000 and the LDPC decoder 1000 have, for example, the following differences.

The LDPC decoder 1000 has been described above as performing decode processing on the basis of the parity check matrix CM10. The LDPC decoder 2000, on the other hand, decodes original data from data encoded based on one of four types of parity check matrix, that is, matrices CM21, CM22, CM23, and CM24 illustrated in FIGS. 14A, 14B, 15A, and 15B. The parity check matrices CM21 to CM24 are pre-defined and are also shared by an LDPC encoding device (not illustrated).

Figures 14A, 14B:
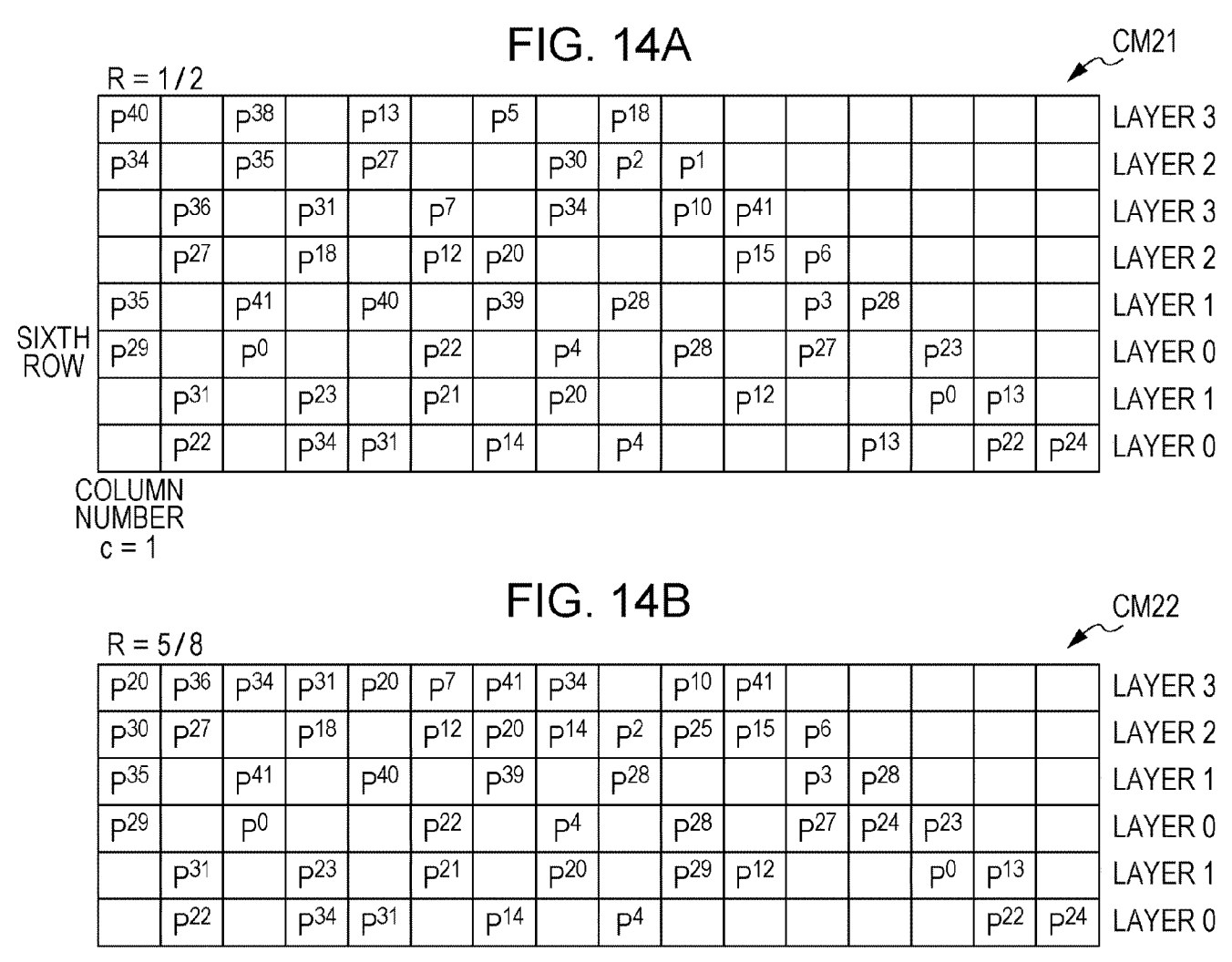

FIG. 14A is a schematic diagram illustrating one example of the parity check matrix CM21 for a coding rate R of 1/2. FIG. 14B is a schematic diagram illustrating one example of the parity check matrix CM22 for a coding rate R of 5/8.

FIG. 15A is a schematic diagram illustrating one example of the parity check matrix CM23 for a coding rate R of 3/4. FIG. 15B is a schematic diagram illustrating one example of the parity check matrix CM24 for a coding rate R of 13/16.

The control unit 2700 uses the coding rate R to determine which of the parity check matrices CM21 to CM24 is to be used. When the LDPC encoder performs LDPC encoding, information of the coding rate R is inserted into a header of encoded data. The control unit 2700 obtains the information of the coding rate R from the header of the input data including LDPC codes.

For example, for the coding rate R=3/4, the LDPC decoder 2000 performs substantially the same operation as that of the LDPC decoder 1000. That is, the LDPC decoder 1000 is one example of an LDPC decoder for the coding rate R=3/4.

In the LDPC decoder 1000, for example, one variable shifter is responsible for shift processing for one row; for example, the variable shifter 1510 is responsible for shift processing for the first row. In the LDPC decoder 2000, on the other hand, the number of rows in the parity check matrices CM21, CM22, and CM24 whose coding rates R are other than 3/4 is not four.

Accordingly, in the LDPC decoder 2000, one or two rows are handled as a unit of "layer", and one variable shifter is responsible for shift processing for one layer. Associations illustrated in FIGS. 14A, 14B, 15A, and 15B have been known as associations between the rows and the layers.

For example, the variable shifter 2510 performs shift processing on layer 3. The variable shifter 2520 performs shift processing on layer 2. The variable shifter 2530 performs shift processing on layer 1. The variable shifter 2540 performs shift processing on layer 0.

Next, a description will be given of a first example of functions and configurations of the variable shifters 2510, 2520, 2530, and 2540. The variable shifters 2510, 2520, 2530, and 2540 may also have the same function and the same configuration. Herein, the variable shifter 2540 will be mainly described by way of example.

FIGS. 16A to 16D are tables each illustrating one example of the relationship of the column number c and the shift amounts s, s1, and s2 for each coding rate R of the variable shifter 2540. The variable shifter 2540 is responsible for shift processing for layer 0. In FIGS. 16A to 16D, the shift amounts s, s1, and s2 for each coding rate R of the variable shifter 2540 are determined in accordance with the parity check matrices CM21 to CM24.

For example, for the coding rate R=1/2, the column number c=1, and the layer 0, the control unit 2700 specifies the shift amount s=29 by referring to the sixth row in the parity check matrix CM21. All of the shift amounts s in FIGS. 16A to 16D are determined in accordance with the parity check matrices CM21 to CM24 in FIGS. 14A to 15B, and possible values of the shift amount s, except for redundant values, are listed as s={0, 2, 3, 4, 13, 14, 15, 18, 22, 23, 24, 25, 27, 28, 29, 31, 34}. Thus, in this case, the number "K" of possible types of the shift amount s is 17. The possible values of the shift amount s are examples of a pattern of input shift amounts.

That is, with respect to the parity check matrices for all coding rates to which the LDPC decoder 2000 correspond, the possible values of the shift amount s, except for redundant values, can be listed to determine the number "K" of possible types of shift amount s. In addition, dividing the shift amount s into the shift amounts s1 and s2 makes it possible to limit the elements of the shift amounts s1 and s2 and makes it possible to reduce the number of selector circuits in the cyclic shifter circuit.

Figure 17:
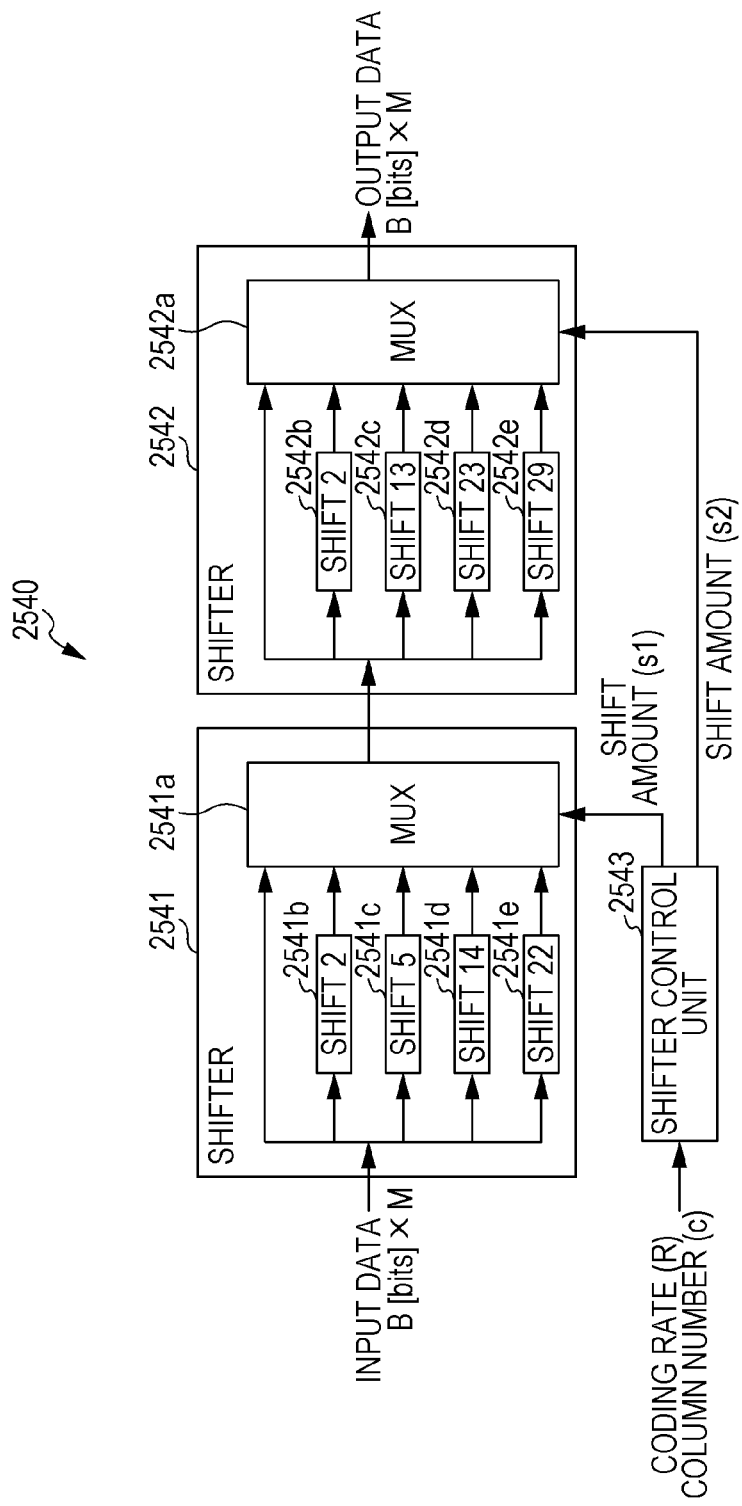
FIG. 17 is a block diagram illustrating a first example configuration of a variable shifter in the fourth embodiment.

FIG. 17 is a block diagram illustrating a configuration example of the variable shifter 2540. The variable shifter 2540 has a configuration including shifters 2541 and 2542 and a shifter control unit 2543.

The shifter 2541 includes a multiplexer 2541a and four fixed shifters 2541b, 2541c, 2541d, and 2541e. The multiplexer 2541a is a five-input multiplexer. In accordance with the value of the shift amount s1 specified by the shifter control unit 2543, the shifter 2541 selects one of five different shift amounts indicated by s1={0, 2, 5, 14, 22} and performs shift processing.

The shifter 2542 includes a multiplexer 2542a and four fixed shifters 2542b, 2542c, 2542d, and 2542e. The multiplexer 2542a is a five-input multiplexer. In accordance with the value of the shift amount s2 specified by the shifter control unit 2543, the shifter 2542 selects one of five different shift amounts indicated by s2={0, 2, 13, 23, 29} and performs shift processing.

The shifter control unit 2543 receives the information of the coding rate R and the information of the column number c from the control unit 2700. In response to the coding rate R and the column number c, the shifter control unit 2543 determines the two shift amounts s1 and s2 in accordance with the tables in FIGS. 16A to 16D and controls the multiplexers 2541a and 2542a. Thus, the shifter control unit 2543 corresponds to, for example, the control unit 130 in the variable shifter 100.

Next, a description will be given of a second example of the functions and configurations of the variable shifters 2510, 2520, 2530, and 2540. The variable shifters 2510, 2520, 2530, and 2540 may have the same function and the configuration. Herein, the variable shifter 2510 will be mainly described by way of example.

FIGS. 18A to 18D are tables each illustrating one example of the relationship of the column number c and the shift amounts s, s1, and s2 for each coding rate R of the variable shifter 2510. The variable shifter 2510 is responsible for shift processing for layer 3. In FIGS. 18A to 18D, the shift amounts s, s1, and s2 for each coding rate R of the variable shifter 2510 are determined in accordance with the parity check matrices CM21 to CM24.

For the coding rate R=13/16, the coding rate=1−(the number of rows/the number of columns)=1−(3/16)=13/16 is obtained, and thus, layer 3 does not exist, as illustrated in FIG. 15B. Accordingly, the variable shifter 2510 does not operate and outputs no data or a value 0.

When all of the shift amount s in FIGS. 18A to 18D are determined, the number "K" of possible types of shift amount s is 20. The possible values of the shift amount s, except for redundant values, are given as s={3, 5, 6, 7, 10, 13, 17, 18, 19, 20, 22, 28, 31, 34, 35, 36, 38, 39, 40, 41}.

The shift amounts s are also determined for other layers, and redundant shift amounts s are deleted. The LDPC decoder 1000 stores the determined non-redundant shift amounts s for all the layers and configures the variable shifters by appropriately using the shift amounts s in accordance with the coding rate and the layers.

Figure 19:
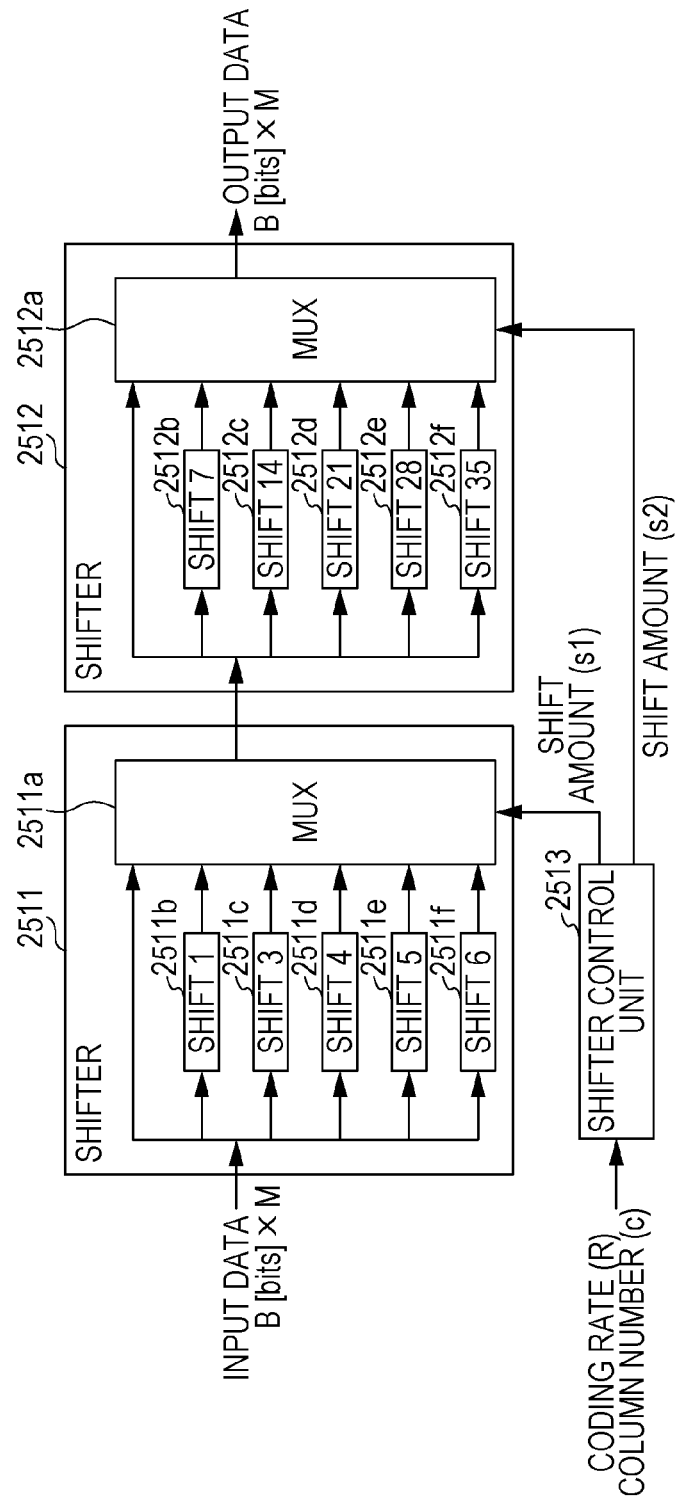
FIG. 19 is a block diagram illustrating a second example configuration of the variable shifter in the fourth embodiment.

FIG. 19 is a block diagram illustrating a configuration example of the variable shifter 2510. The variable shifter 2510 has a configuration including shifters 2511 and 2512 and a shifter control unit 2513.

The shifter 2511 includes a multiplexer 2511a and five fixed shifters 2511b, 2511c, 2511d, 2511e, and 2511f. The multiplexer 2511a is a six-input multiplexer. In accordance with the value of the shift amount s1 specified by the shifter control unit 2513, the shifter 2511 selects one of six different shift amounts indicated by s1={0, 1, 3, 4, 5, 6} and performs shift processing.

The shifter 2512 includes a multiplexer 2512a and five fixed shifters 2512b, 2512c, 2512d, 2512e, and 2512f. The multiplexer 2512a is a six-input multiplexer. In accordance with the value of the shift amount s2 specified by the shifter control unit 2513, the shifter 2512 selects one of six different shift amounts indicated by s2={0, 7, 14, 21, 28, 35} and performs shift processing.

The shifter control unit 2513 receives the information of the coding rate R and the information of the column number c from the control unit 2700. In response to the coding rate R and the column number c, the shifter control unit 2513 determines the two shift amounts s1 and s2 in accordance with the tables in FIGS. 18A to 18D and controls the multiplexers 2511a and 2512a. Thus, the shifter control unit 2513 corresponds to, for example, the control unit 130 in the variable shifter 100.

As described above, on the basis of the tables in FIGS. 18A to 18D, the variable shifter 2510 performs shift processing for 20 different shift amounts s by using a combination of the six different shift amounts indicated by s1={0, 1, 3, 4, 5, 6} and the six different shift amounts indicated by s2={0, 7, 14, 21, 28, 35}. Hence, according to the variable shifter 2510, it is possible to reduce the circuit complexity and the power consumption, compared with the barrel shifter of the related art.

The variable shifters 2610, 2620, 2630, and 2640 perform shift processing on data output from the variable node processing unit 1300. Similarly to the variable shifters 2510, 2520, 2530, and 2540, the variable shifters 2610, 2620, 2630, and 2640 determine the shift amounts s in accordance with the respective parity check matrices CM21 to CM24 and the column number c specified by the control unit 2700.

However, the variable shifters 2610, 2620, 2630, and 2640 shift the data in directions opposite to those in the variable shifters 2510, 2520, 2530, and 2540. For example, the variable shifter 2510 shifts the data to the right, and the variable shifter 2610 shifts the data to the left.

FIGS. 20A to 20D are tables each illustrating one example of the relationship of the column number c and the shift amounts s, s1, and s2 for each coding rate R of the variable shifter 2530. The variable shifter 2530 is responsible for shift processing for layer 2. In FIGS. 20A to 20D, the shift amounts s, s1, and s2 for each coding rate R of the variable shifter 2530 are determined in accordance with the parity check matrices CM21 to CM24 illustrated in FIGS. 14A to 15B.

Next, one example of a method for deriving the shift amounts s1 and s2 illustrated in FIGS. 16A to 16D and FIGS. 18A to 18D will be described in detail.

First, a description will be given of a first derivation method. The variable shifter 2510 illustrated in FIG. 19 is designed, for example, using the first derivation method. The variable shifter 2510 is designed by a predetermined apparatus before the LDPC decoder 2000 performs LDPC decoding on predetermined data. The predetermined apparatus has, for example, a read only memory (ROM), a random access memory (RAM), and a central processing unit (CPU), and the CPU may execute a predetermined program held in the RAM.

In the first derivation method, first, an integer m that is 2 or more and that is less than an integer M is selected. In this case, for example, when a value close to a square root of M or a divisor of M is selected as the integer m, it is easy to reduce the circuit complexity of the variable shifter 2510.

Subsequent to the selection of the integer m, the elements of the shift amounts s1 and s2 are determined based on equation 5 below. For the value of one shift amount s (s is 0 to less than M), the values of the shift amounts s1 and s2 that satisfy equation 1 are uniquely determined.

$$s1=\{\text{integers that are 0 or more and that are less than } m\}$$

$$s2=\{\text{multiples of m that is larger than or equal to } m \text{ and that is less than } M\} \quad \text{(equation 5)}$$

Subsequently, unnecessary values of the shift amounts s1 and s2 are excluded for the possible values of the shift amount s.

The integer m and the shift amounts s1 and s2 defined in equation 5 and used for, for example, design of the variable shifter 2510 are:

m=7,
s1={0, 1, 2, 3, 4, 5, 6}, and
s2={0, 7, 14, 21, 28, 35}.

In FIGS. 18A to 18D, since "2" is not used as the shift amount s1, s1=2 may also be excluded. The shift amounts s1 are determined to be {0, 1, 3, 4, 5, 6}. As a result of exclusion of s1=2, it is possible to reduce the number of fixed shifters without dealing with unnecessary shift amounts, thus making it possible to reduce the circuit complexity and the power consumption of the variable shifter.

The value "2" not being used as the shift amount s1 means that, when possible values of the shift amount s are to be determined, "2" is not used as the shift amount s1 derived from equation 1, with respect to all possible shift amounts s. That is, the shift amount "2" that is not used since it satisfies equation 1 is excluded from the elements of the shift amount s1 derived from equation 5. Although the shift amount that is not used as the shift amount s1 has been described in this case as an example, the same also applies to a shift amount that is not used as the shift amount s2.

According to the first derivation method, since the number of stages of the fixed shifters decreases, the circuit complexity decreases to thereby allow a reduction in the power, compared with the barrel shifter of the related art. The reduced number of stages also makes it possible to reduce the amount of delay in the circuit and makes it possible to increase the operating clock frequency of the LDPC decoder 2000.

Next, a description will be given of a second derivation method.

The variable shifter 2540 illustrated in FIG. 17 is designed, for example, using the second derivation method. The variable shifter 2540 is designed by a predetermined apparatus before the LDPC decoder 2000 performs LDPC decoding on predetermined data. The predetermined apparatus has, for example, a ROM, a RAM, and a CPU, and the CPU executes a predetermined design program held in the RAM to thereby perform simulation.

First, in the second derivation method, integers m and n that satisfy equation 6 below and that are 2 or more and less than M are arbitrarily selected.

$$K \leq m \times n \quad \text{(equation 6)}$$

Subsequently, m integers that are 0 or more and that are less than M are selected without redundant values, and the selected integers are determined to be candidates of the elements of the shift amount s1. Also, n integers that are 0 or more and that are less than M are selected without redundant values, and the selected integers are determined to be candidates of the elements of the shift amount s2. The candidates of the elements of the shift amount s1 and the candidates of the elements of the shift amount s2 may be partly redundant. The procedure described in this paragraph is referred to as a "procedure A".

Subsequently, the candidates of the elements of the shift amount s1, the candidates of the elements of the shift amount s2, and equation 1 noted above are used to determine whether or not it is possible to deal with all possible values of the shift amount s. For example, the control unit makes the determination by sequentially varying the candidates of the elements of the shift amount s1 and the candidates of the elements of the shift amount s2.

When the result of the determination indicates that it is possible to deal with all possible values of the shift amount s, the candidates that can be dealt with are determined to be the elements of the shift amounts s1 and s2. When the result of the determination indicates that it is not possible to deal with at least one of the possible values of the elements of the shift amounts s, the candidates of the elements of the shift amount s1 and the candidates of the elements of the shift amount s2 are re-selected, and a similar determination is repeated.

Subsequently, if elements with which it is possible to deal with all possible values of the shift amount s do not exist even when the determination is made using all of the candidates of the elements of the shift amount s1 and the candidates of the elements of the shift amount s2, the value of the integer m or the integer n is incremented by "1", and the determination of the candidates of the elements of the shift amount s1 and the candidates of the elements of the shift amount s2 is repeated.

For example, in FIGS. 16A to 16D, the possible values of the shift amount s are determined in association with layer 0 in FIGS. 14A to 15B and are given as:

s={0, 2, 3, 4, 13, 14, 15, 18, 22, 23, 24, 25, 27, 28, 29, 31, 34}

Since K is 17 in FIGS. 16A to 16D, m=4 and n=5 with which the value of m×n is the closest to K are first selected as the integers m and n that satisfy equation 6. In this case, for m=4 and n=5, even when all candidates of the elements of the possible shift amounts s1 and s2 are searched for, the elements of the shift amounts s1 and s2 with which it is possible to deal with all of the possible values of the shift amount s do not exist, and thus the process proceeds to searching for next candidates.

Next, the value of the integer m is incremented by "1", and candidates of the elements of the possible shift amounts s1 and s2 are searched for with respect to m=5 and n=5. As a result of the searching, s1={0, 2, 5, 14, 22} and s2={0, 2, 13, 23, 29} are determined to be the elements of the shift amounts s1 and s2 in the variable shifter 2540 (see FIGS. 16A to 16D).

With respect to all possible shift amounts s, the shift amounts s1 and s2 that satisfy equation 1 are determined among the elements of the shift amounts s1 and s2 derived according to the above-described procedure A, so that the shift amounts included as the elements of the shift amounts s1 and s2 are determined.

According to the second derivation method, the number of elements of the possible shift amounts s1 and s2 is reduced compared with the first derivation method, thus making it possible to further reduce the number of fixed shifters and making it possible to reduce the circuit complexity and the power consumption of the variable shifter.

In the LDPC decoder 2000, two shifter circuits (e.g., the shifters 2511 and 2521) are connected in series. Also, considering the coding rate R, the LDPC decoder 2000 performs shift processing in accordance with the shift amounts s1 and s2 determined based on the parity check matrices CM21 to CM24 for LDPC codes and decodes data.

According to the LDPC decoder 2000, since the shift amounts s1 and s2 that can be taken by the shifters in the two shifter circuits are limited, it is possible to reduce the number of selector circuits in the cyclic shifter circuit. Accordingly, since the circuit complexity of the two shifter circuits is reduced, the circuit complexity and the power consumption of the LDPC decoder 2000 can be reduced, and the LDPC decoder 2000 can operate at high speed. Also, even when the coding rate R for LDPC codes changes, decoding can be performed according to the coding rate R.

In the present embodiment, the above description has been given of an example in which each of the variable shifters 2510, 2520, 2530, 2540, 2610, 2620, 2630, and 2640 corresponds to one layer in the parity check matrices CM21 to CM24, and the shift amounts s, s1, and s2 are determined according to the column number c.

For example, one of the variable shifters 2510, 2520, 2530, 2540, 2610, 2620, 2630, 2640 may correspond to a plurality of layers, and the shift amounts s, s1, and s2 may be determined in accordance with the column number c and the layer number of the parity check matrix CM21.

A plurality of variable shifters may also correspond to one layer. For example, two variable shifters may be made to correspond to the even-numbered columns and odd-numbered columns, respectively, in the parity check matrices CM21 to CM24, and the two variable shifters may be made to correspond to one layer. One layer and the plurality of layers in the parity check matrix CM21 are examples of an area to be processed in a parity check matrix.

Also, one of the variable shifters 2510, 2520, 2530, 2540, 2610, 2620, 2630, and 2640 may correspond to one or more columns in the parity check matrices CM21 to CM24. Also, the correspondences between the matrix elements in the parity check matrices CM21 to CM24 and the variable shifters may also be arbitrarily determined, rather than the correspondence using a unit of columns or layers in the parity check matrices CM21 to CM24.

The present disclosure is not limited to the configurations in the above-described embodiments and is applicable to any configuration that can realize the functions recited in the appended claims or the functions of the configurations in the embodiments.

Although the descriptions in the above embodiments have been given of examples of a case in which the present disclosure is implemented by hardware, the present disclosure may also be realized by software in cooperation with hardware.

The functional blocks used in the descriptions in the above embodiments are typically realized as a large-scale integration (LSI) circuit. The functional blocks may be individually integrated into a single chip or at least one or all of the functional blocks may be integrated into a single chip. In this case, the functional blocks may be called an LSI, or may be called an integrated circuit (IC), a system LSI, a super LSI, or an ultra LSI depending on the difference of the degree of integration.

A scheme for integrating the functional blocks into an integrated circuit is not a limited to a scheme used for LSI and may be realized with a dedicated circuit or a general-purpose processor. For example, the functional blocks can also be implemented using a field programmable gate array (FPGA) that can be programmed after manufacture of an LSI circuit, connections of circuit cells in an LSI, or a reconfigurable processor that can reconfigure settings.

In addition, when a technology for circuit integration that replaces LSI becomes available with advancement of the semiconductor technology or another derivative technology, such a technology may also naturally be used to integrate the functional blocks. For example, biotechnology is applicable to the integration.

(Overview of One Aspect of Present Disclosure)

A first variable shifter according to the present disclosure includes:

a plurality of shifters that cyclically shift input data having a plurality of bits or cyclically shifted data; and a control unit that selects a shift amount for each of the plurality of shifters in accordance with one of a plurality of predetermined cyclic shift amounts, wherein the number of types of the plurality of predetermined cyclic shift amounts is smaller than the number of bits in the input data, each shifter shifts the input data having a plurality of bits or the cyclically shifted data with the selected one of a plurality of shift amounts in accordance with the predetermined cyclic shift amount, and the plurality of shift amounts comprise a combination of shift amounts that differ from one shifter to another.

A second variable shifter according to the present disclosure is the first variable shifter, and in accordance with the predetermined cyclic shift amount, the control unit selects the shift amount for each shifter, the shift amount satisfying:

$$s=(s1+s2+ \ldots +sn) \bmod M$$

where M indicates the number of bits in the input data, s indicates the predetermined cyclic shift amount, and sn (n is an integer) indicates the shift amount selected for each shifter.

A third variable shifter according to the present disclosure is the first variable shifter, and the plurality of shifters comprise a first shifter that cyclically shifts the input data and a second shifter that cyclically shifts the data cyclically shifted by the first shifter.

A fourth variable shifter according to the present disclosure is the first variable shifter, and the control unit selects, for each shifter, one of the plurality of shift amounts in accordance with a submatrix to be processed in a predetermined parity check matrix.

A fifth variable shifter according to the present disclosure is the fourth variable shifter, and the control unit selects, for each shifter, one of the plurality of shift amounts in accordance with a coding rate of the input data.

A sixth variable shifter according to the present disclosure is the third variable shifter, the first shifter comprises a plurality of shift amounts that are smaller than a predetermined amount, and the second shifter comprises a plurality of shift amounts that are multiples of the predetermined amounts.

A seventh variable shifter according to the present disclosure is the third variable shifter, and a product of the number of shift amounts for the first shifter and the number of shift amounts for the second shifter is larger than or equal to the number of types of the predetermined cyclic shift amount.

A first decoder according to the present disclosure is a decoder that decodes data, encoded using a linear code, by using a predetermined parity check matrix including a combination of submatrices indicating cyclic shifts of predetermined shift size, and includes:
a plurality of variable shifters;
a variable node processing unit that performs variable node processing in response to pieces of data or data from the variable shifters; and
a check node processing unit that performs check node processing in response to data from the variable shifters; and
a control unit that selects a combination of shift amounts for each variable shifter in accordance with a cyclic shift amount based on the predetermined check matrix,
wherein each variable shifter comprises of a plurality of shifters, which each of the plurality of shifters cyclically shifts output data of the variable node processing unit or the check node processing unit or shifted data using the selected combination of shift amounts,
the number of types of the cyclic shift amount for each variable shifter is smaller than the number of elements in the input data, and
the combination of shift amounts for each variable shifter differs from each other.

A second decoder according to the present disclosure is the first decoder, and,
in accordance with the predetermined cyclic shift amount, the control unit selects the combination of shift amounts for the each of variable shifters, the shift amounts satisfying:

$s=(s1+s2+ \ldots +sn) \bmod M$ where M indicates the number of bits in the input data, s indicates the predetermined cyclic shift amount, and sn (n is an integer) indicates each of the plurality of shift amounts.

A data shifting method according to the present disclosure is a data shifting method for a variable shifter including a plurality of shifters that cyclically shift input data having a plurality of bits or cyclically shifted data to cyclically shift the input data having the plurality of bits, and includes:
selecting a shift amount for each of the plurality of shifters in accordance with one of a plurality of predetermined cyclic shift amounts; and
cyclically shifting, by the plurality of shifters, input data having a plurality of bits or cyclically shifted data,
wherein, in the selecting the shift amount for each shifter, one of a plurality of shift amounts is selected in accordance with the predetermined cyclic shift amount,
the number of types of the predetermined cyclic shift amount is smaller than the number of bits in the input data, and
the plurality of shift amounts comprise a combination of shift amounts that differ from one shifter to another.

The present disclosure is useful for variable shifters, LDPC decoders, and data shifting methods that can reduce the circuit complexities and that can reduce the power consumption.

What is claimed is:

1. A variable shifter comprising:
a plurality of shifters that cyclically shift input data having a plurality of bits or cyclically shifted data; and
a control unit that selects a shift amount for each of the plurality of shifters in accordance with one of a plurality of predetermined cyclic shift amounts,
wherein the number of types of the plurality of predetermined cyclic shift amounts is smaller than the number of bits in the input data,
each shifter shifts the input data having a plurality of bits or the cyclically shifted data with the selected one of a plurality of shift amounts in accordance with the predetermined cyclic shift amount, and
the plurality of shift amounts comprise a combination of shift amounts that differ from one shifter to another.

2. The variable shifter according to claim 1,
wherein, in accordance with the predetermined cyclic shift amount, the control unit selects the shift amount for each shifter, the shift amount satisfying:

$s=(s1+s2+ \ldots +sn) \bmod M$ where M indicates the number of bits in the input data, s indicates the predetermined cyclic shift amount, and sn (n is an integer) indicates the shift amount selected for each shifter.

3. The variable shifter according to claim 2,
wherein the plurality of shifters comprise a first shifter that cyclically shifts the input data and a second shifter that cyclically shifts the data cyclically shifted by the first shifter.

4. The variable shifter according to claim 1,
wherein the control unit selects, for each shifter, one of the plurality of shift amounts in accordance with a submatrix to be processed in a predetermined parity check matrix.

5. The variable shifter according to claim 4,
wherein the control unit selects, for each shifter, one of the plurality of shift amounts in accordance with a coding rate of the input data.

6. The variable shifter according to claim 3,
wherein the first shifter comprises a plurality of shift amounts that are smaller than a predetermined amount, and
the second shifter comprises a plurality of shift amounts that are multiples of the predetermined amounts.

7. The variable shifter according to claim 3,
wherein a product of the number of shift amounts for the first shifter and the number of shift amounts for the second shifter is larger than or equal to the number of types of the predetermined cyclic shift amount.

8. A decoder that decodes data, encoded using a linear code, by using a predetermined parity check matrix including a combination of submatrices indicating cyclic shifts of predetermined shift size, the decoder comprising:
a plurality of variable shifters;
a variable node processing unit that performs variable node processing in response to pieces of data or data from the variable shifters; and
a check node processing unit that performs check node processing in response to data from the variable shifters; and
a control unit that selects a combination of shift amounts for each variable shifter in accordance with a cyclic shift amount based on the predetermined check matrix,
wherein each variable shifter comprises of a plurality of shifters, which each of the plurality of shifters cyclically shifts output data of the variable node processing unit or the check node processing unit or shifted data using the selected combination of shift amounts,
the number of types of the cyclic shift amount for each variable shifter is smaller than the number of elements in the input data, and
the combination of shift amounts for each variable shifter differs from each other.

9. The decoder according to claim 8,
wherein, in accordance with the predetermined cyclic shift amount, the control unit selects the combination of shift amounts for the each of variable shifters, the shift amounts satisfying:

$s=(s1+s2+ \ldots +sn) \bmod M$ where M indicates the number of bits in the input data, s indicates the predetermined cyclic shift amount, and sn (n is an integer) indicates each of the plurality of shift amounts.

10. A data shifting method for a variable shifter including a plurality of shifters that cyclically shift input data having a plurality of bits or cyclically shifted data to cyclically shift the input data having the plurality of bits, the data shifting method comprising:
- selecting a shift amount for each of the plurality of shifters in accordance with one of a plurality of predetermined cyclic shift amounts; and
- cyclically shifting, by the plurality of shifters, input data having a plurality of bits or cyclically shifted data,
- wherein, in the selecting the shift amount for each shifter, one of a plurality of shift amounts is selected in accordance with the predetermined cyclic shift amount,
- the number of types of the predetermined cyclic shift amount is smaller than the number of bits in the input data, and
- the plurality of shift amounts comprise a combination of shift amounts that differ from one shifter to another.

\* \* \* \* \*